(12) United States Patent
Xie et al.

(10) Patent No.: US 10,483,363 B2
(45) Date of Patent: Nov. 19, 2019

(54) METHODS OF FORMING A GATE CONTACT STRUCTURE ABOVE AN ACTIVE REGION OF A TRANSISTOR

(71) Applicant: GLOBALFOUNDRIES Inc., Grand Cayman (KY)

(72) Inventors: Ruilong Xie, Niskayuna, NY (US); Hao Tang, Slingerlands, NY (US); Cheng Chi, Jersey City, NJ (US); Daniel Chanemougame, Troy, NY (US); Lars W. Liebmann, Halfmoon, NY (US); Mark V. Raymond, Latham, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 200 days.

(21) Appl. No.: 15/581,105

(22) Filed: Apr. 28, 2017

(65) Prior Publication Data
US 2018/0315822 A1 Nov. 1, 2018

(51) Int. Cl.
*H01L 29/417* (2006.01)
*H01L 21/768* (2006.01)
*H01L 29/66* (2006.01)
*H01L 21/285* (2006.01)
*H01L 23/535* (2006.01)
(Continued)

(52) U.S. Cl.
CPC .. *H01L 29/41775* (2013.01); *H01L 21/28518* (2013.01); *H01L 21/76805* (2013.01); *H01L 21/76895* (2013.01); *H01L 23/535* (2013.01); *H01L 29/41791* (2013.01); *H01L 29/45* (2013.01); *H01L 29/66795* (2013.01); *H01L 29/785* (2013.01)

(58) Field of Classification Search
CPC .................................................. H01L 29/41775
See application file for complete search history.

(56) References Cited

U.S. PATENT DOCUMENTS

| 2005/0040444 A1* | 2/2005 | Cohen ............... H01L 21/82341 257/288 |
| 2006/0148164 A1 | 7/2006 | Park |
| 2013/0248999 A1* | 9/2013 | Glass ..................... H01L 29/36 257/335 |

OTHER PUBLICATIONS

Office Action from related U.S. Appl. No. 15/581,053 dated Jan. 17, 2019.

* cited by examiner

*Primary Examiner* — Lex H Malsawma
*Assistant Examiner* — Geoffrey H Ida
(74) *Attorney, Agent, or Firm* — Amerson Law Firm, PLLC

(57) ABSTRACT

One method includes forming a gate above a semiconductor substrate, the gate comprising a gate structure and a gate cap positioned above the gate structure, forming a conductive source/drain metallization structure adjacent the gate in each of the source/drain regions and forming a recess in each of the conductive source/drain metallization structures. The method further includes forming a spacer structure that comprises recess filling portions that substantially fill the recesses and a portion that extends across the gate cap, wherein a portion of the gate cap is exposed within the spacer structure, forming an insulating material within the spacer structure and on the exposed portion of the gate cap, forming a gate contact opening that exposes a portion of an upper surface of the gate structure and forming a conductive gate contact structure (CB) in the conductive gate contact opening.

20 Claims, 43 Drawing Sheets

(51) Int. Cl.
*H01L 29/45* (2006.01)
*H01L 29/78* (2006.01)

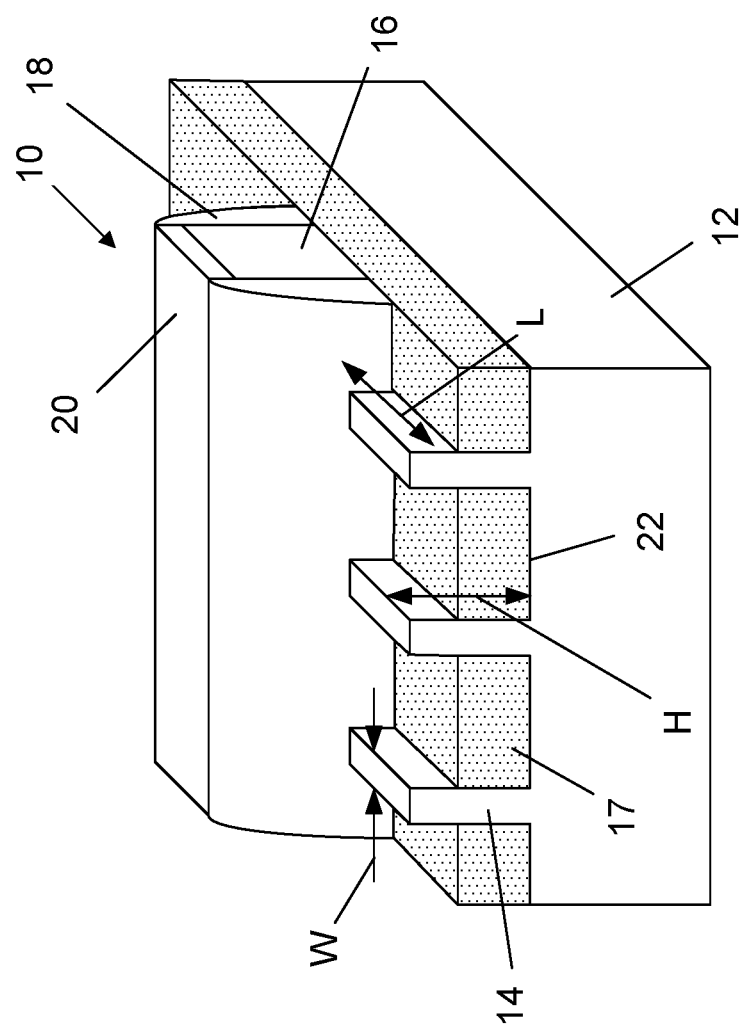

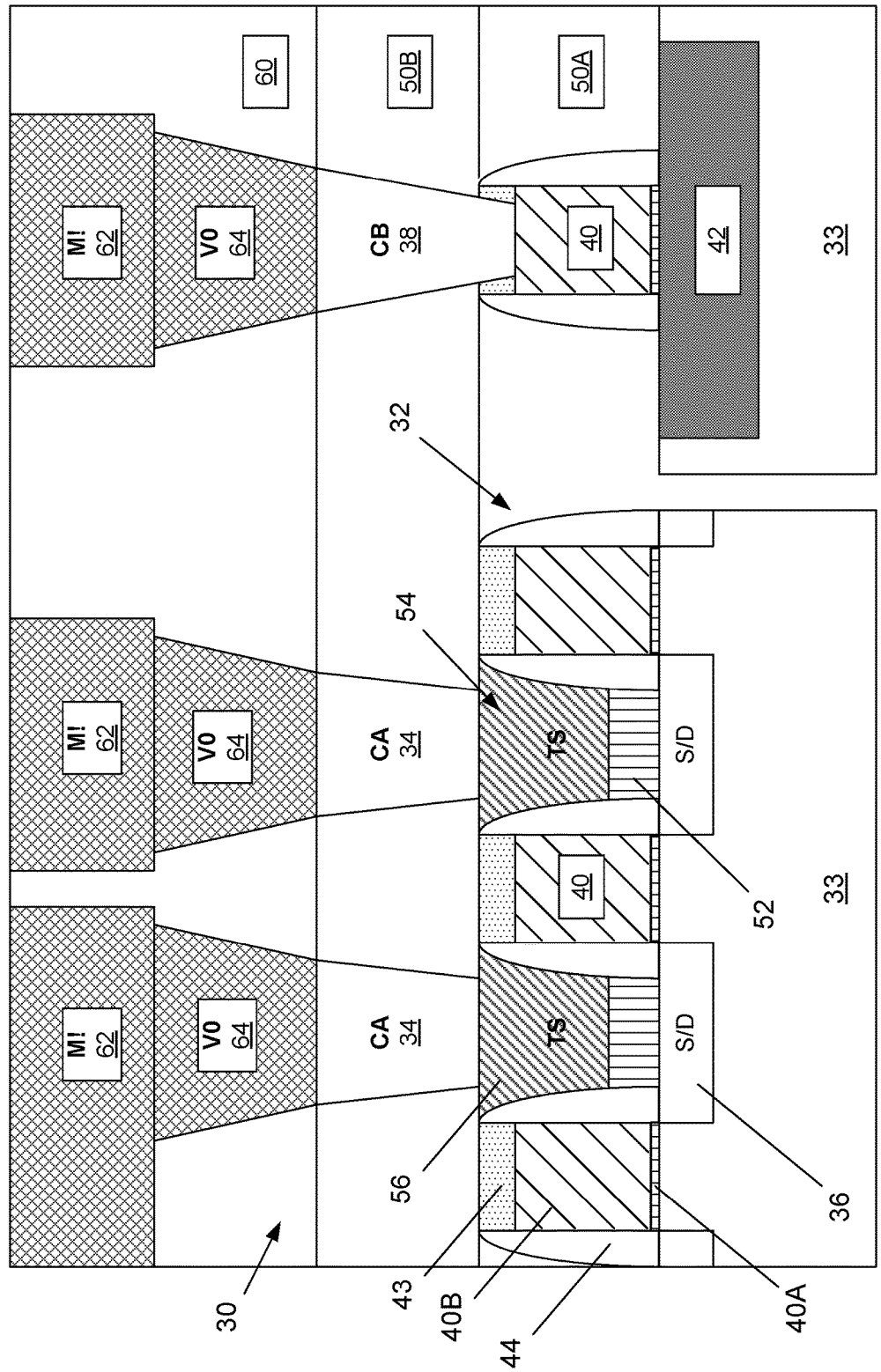

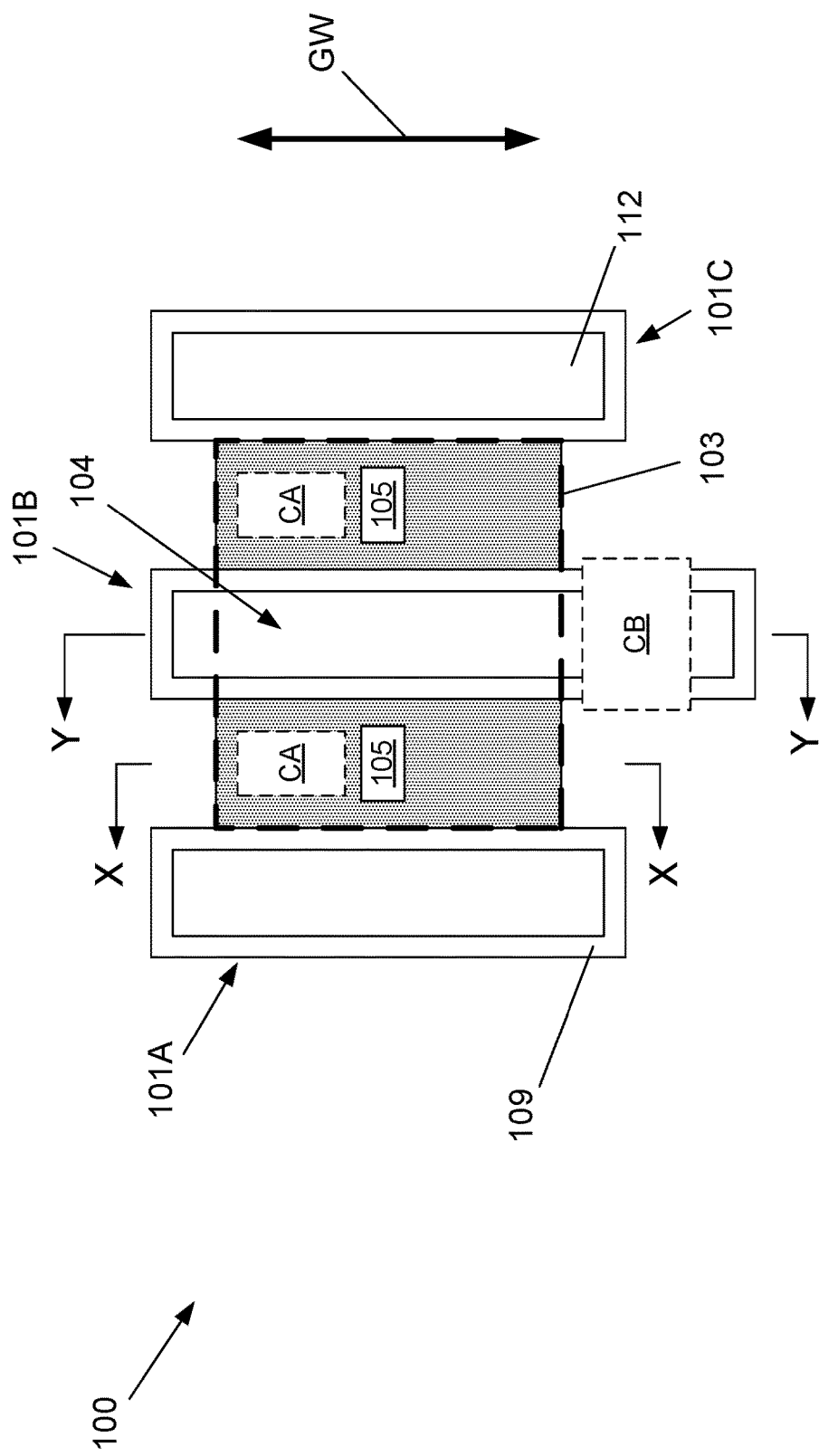

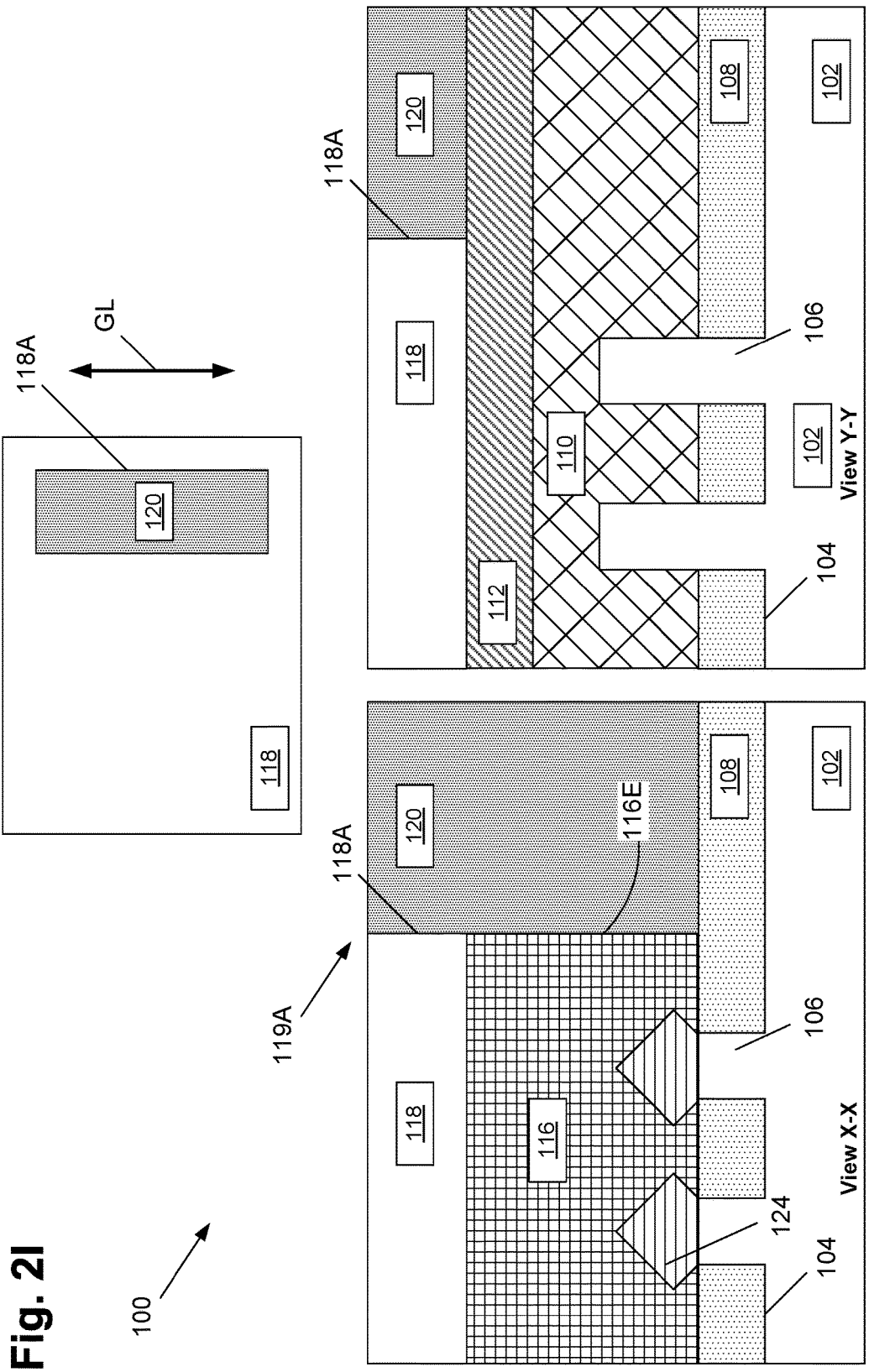

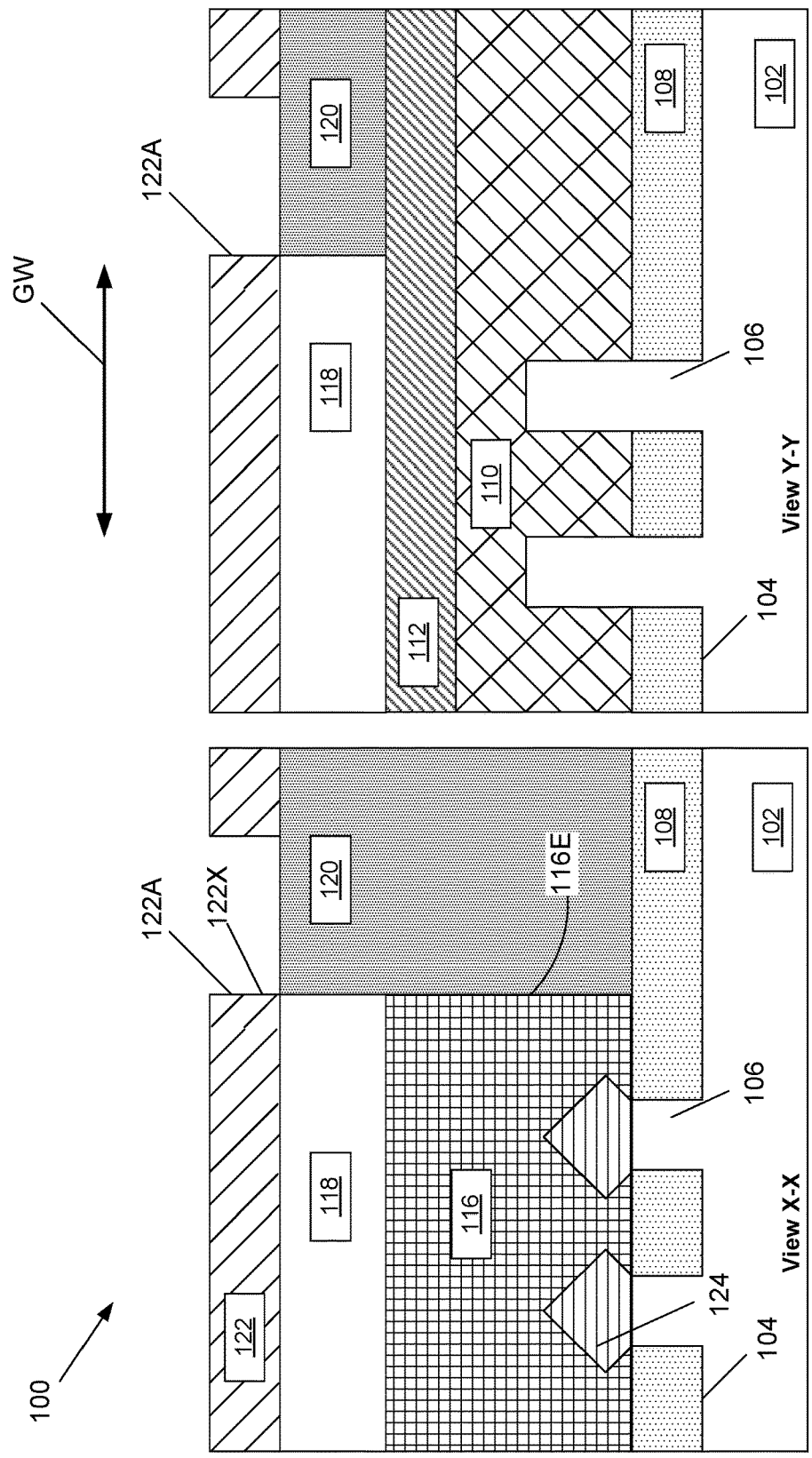

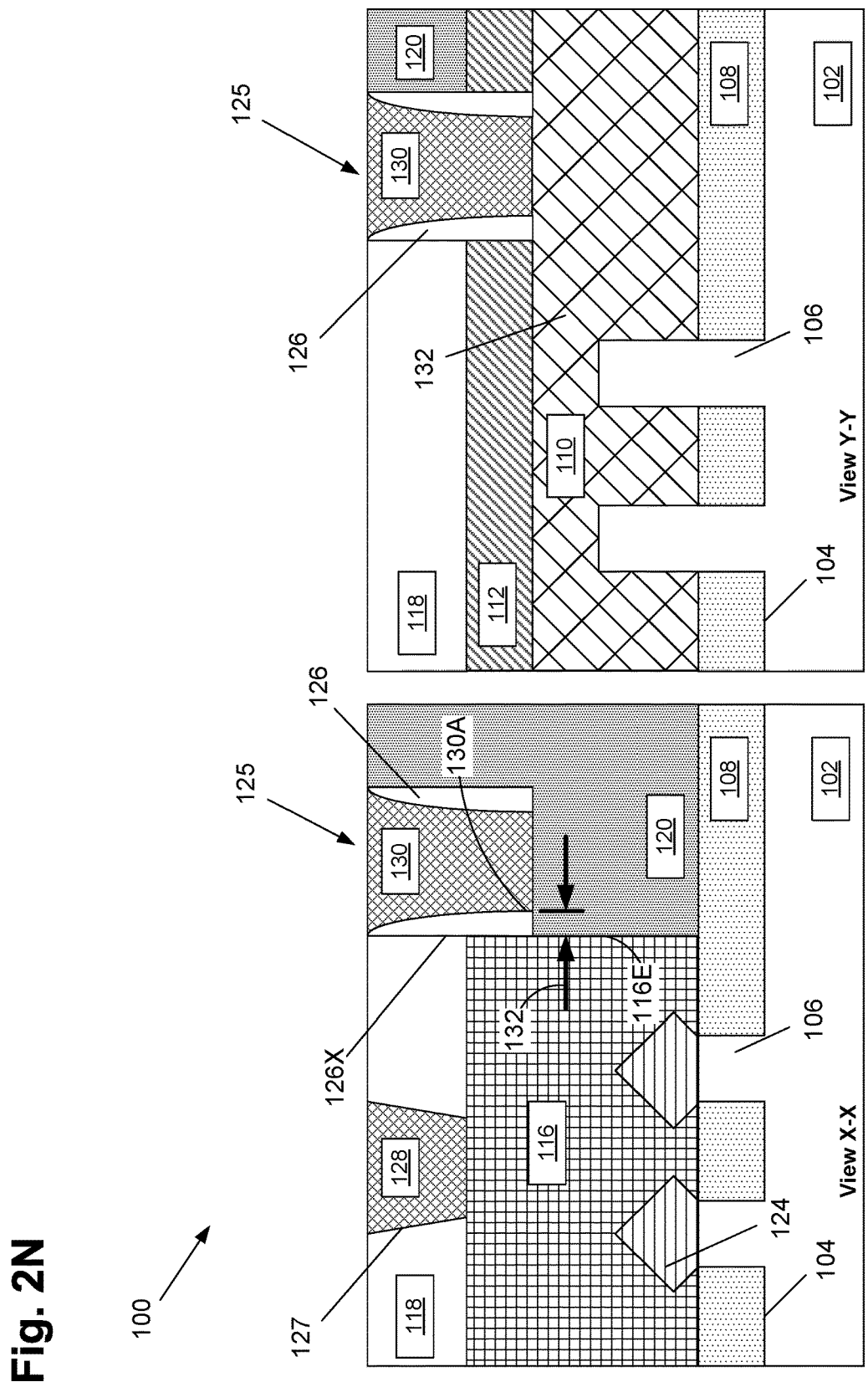

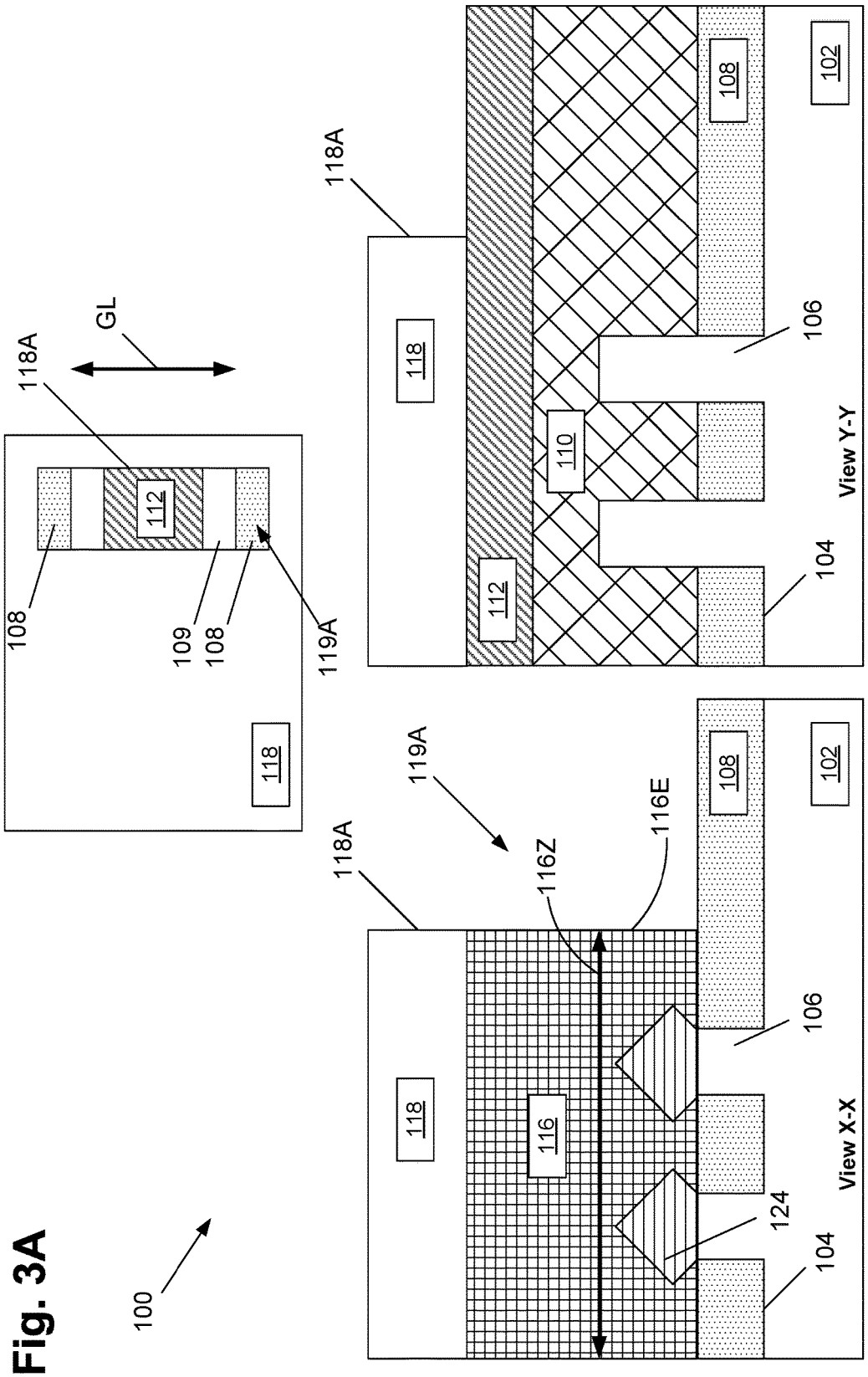

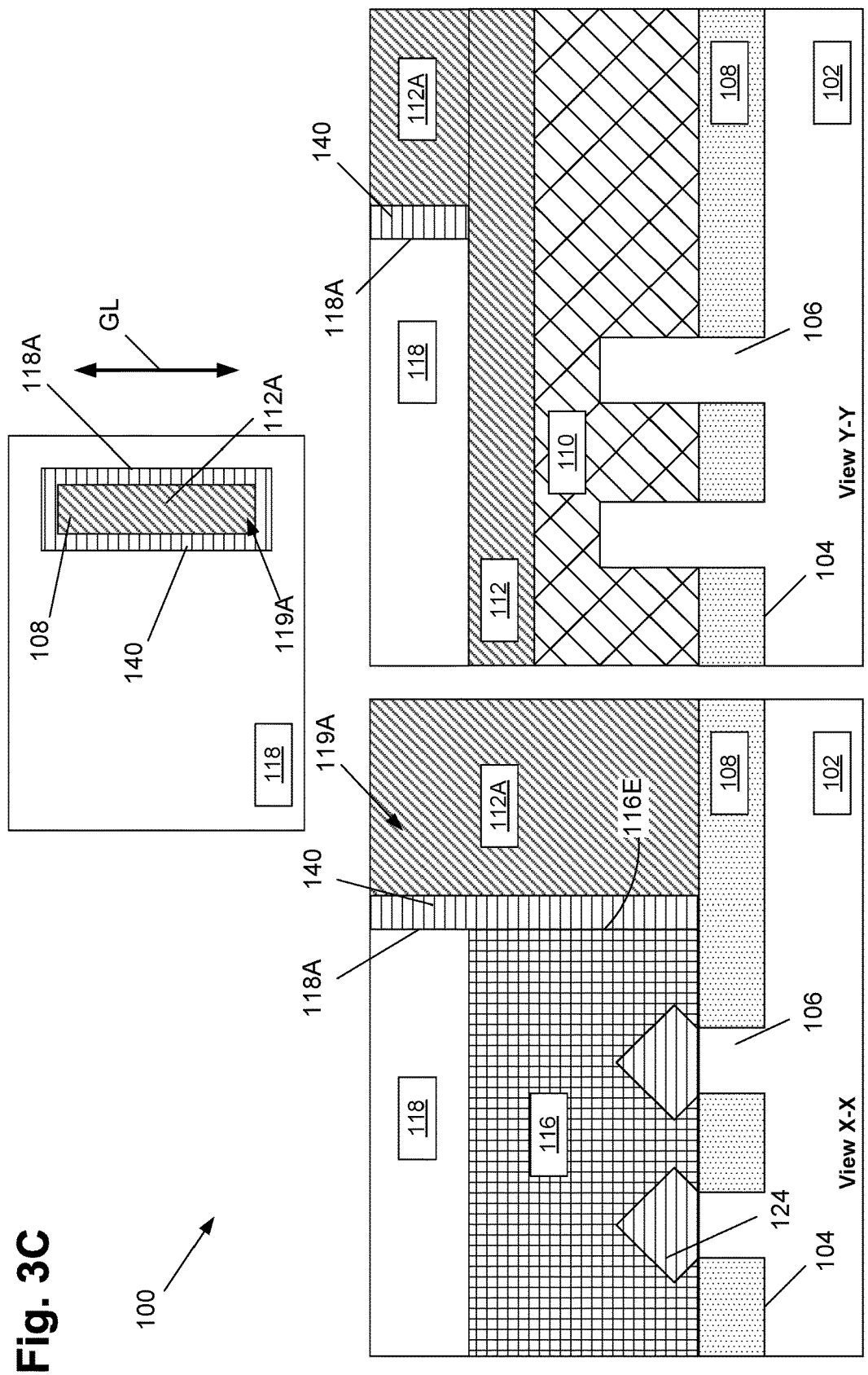

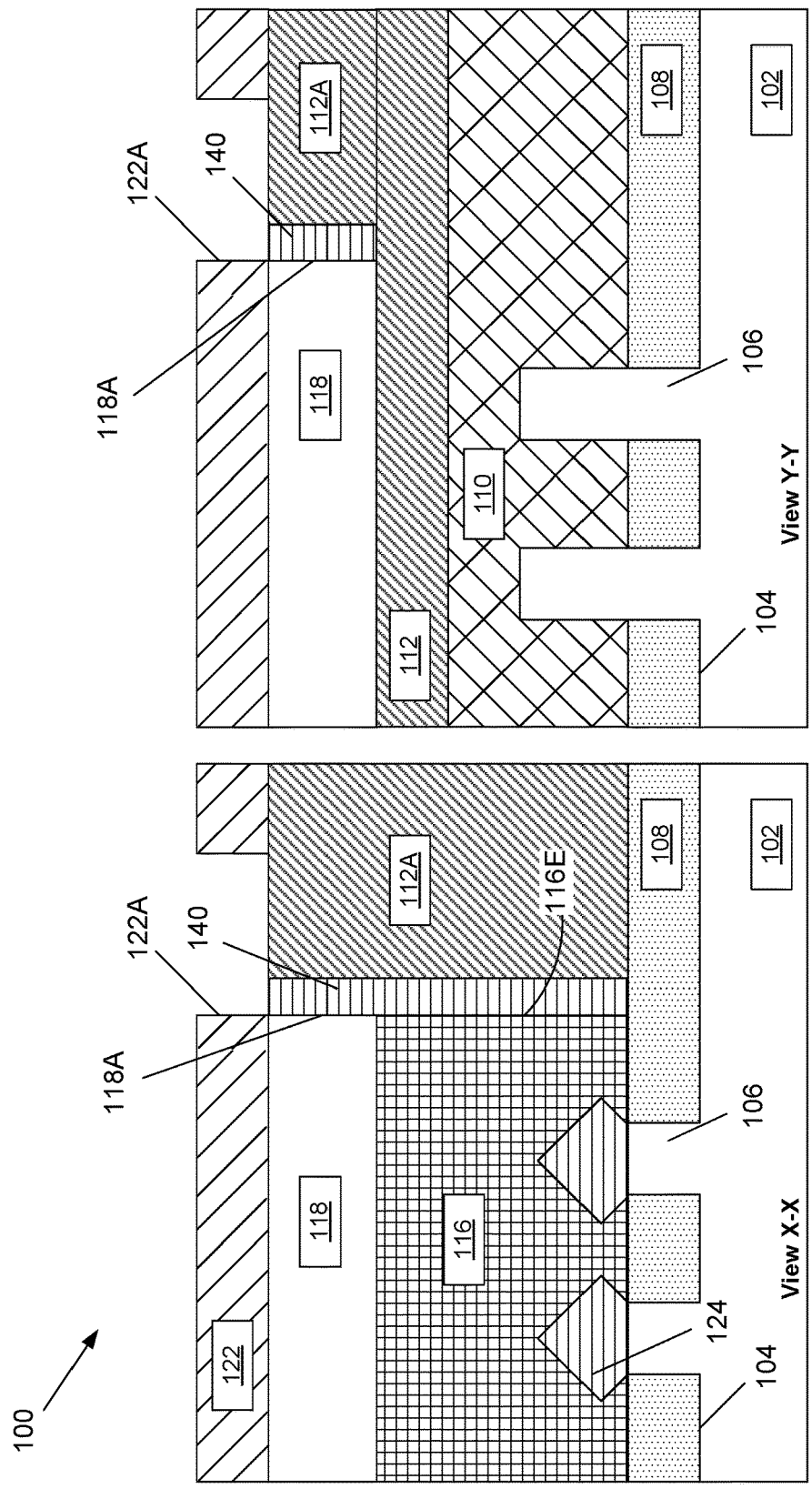

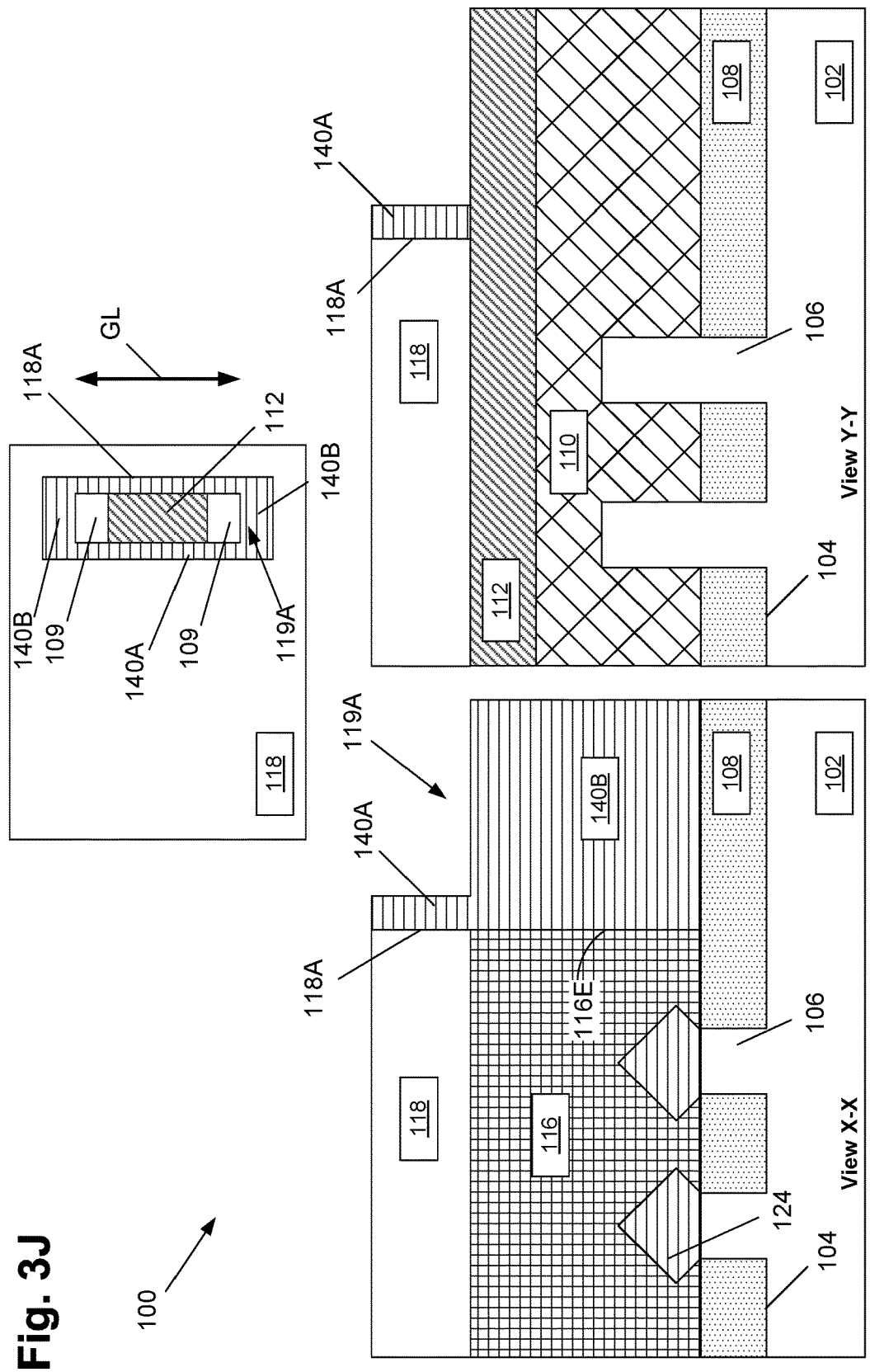

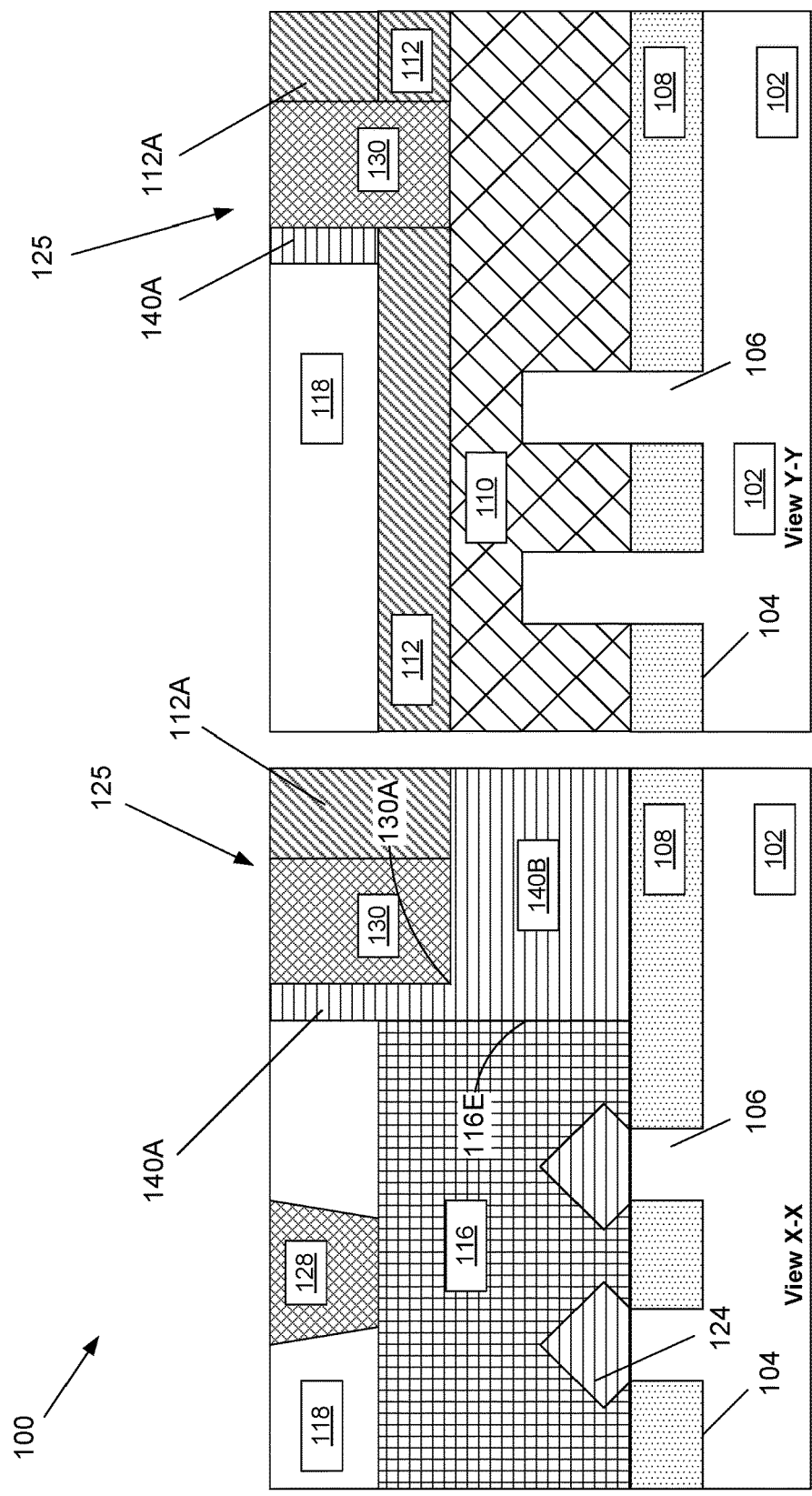

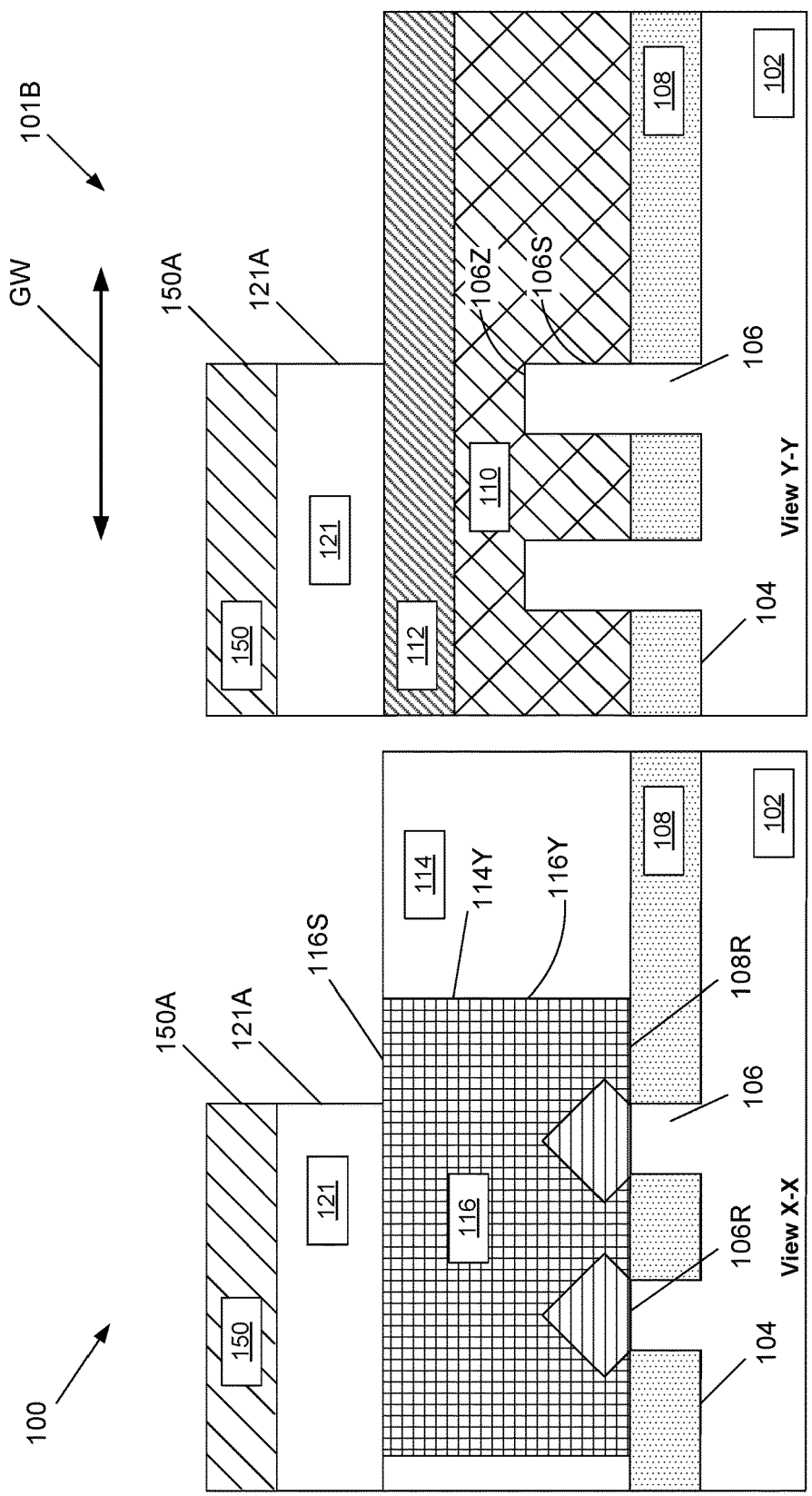

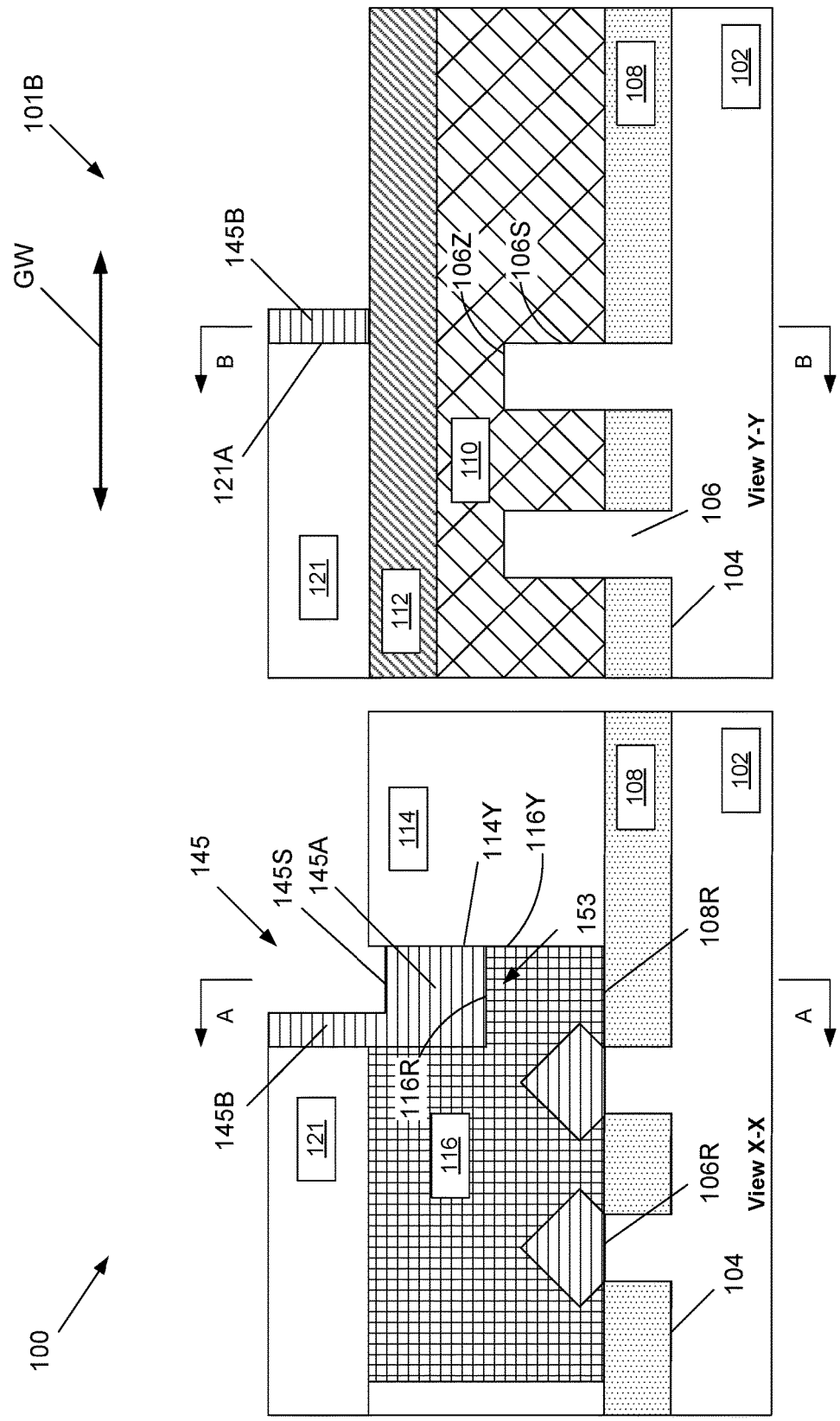

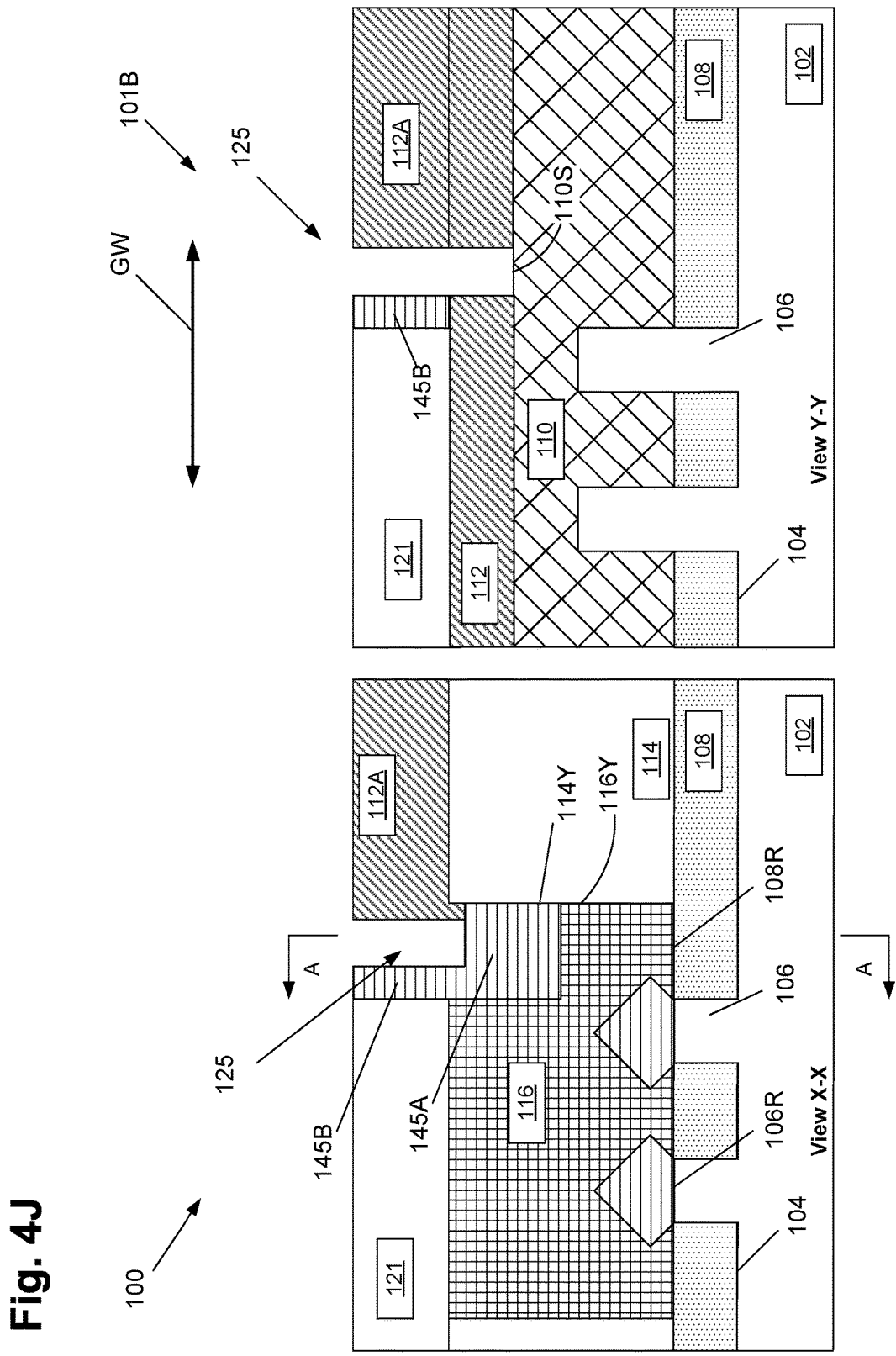

METHODS OF FORMING A GATE CONTACT STRUCTURE ABOVE AN ACTIVE REGION OF A TRANSISTOR

BACKGROUND OF THE INVENTION

1. Field of the Invention

The present disclosure generally relates to the fabrication of integrated circuits, and, more particularly, to various methods of forming a gate contact structure above an active region of a transistor and the resulting devices.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

FIG. 1A is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes three illustrative fins 14, a gate structure 16, a sidewall spacer 18 and a gate cap 20. Fin-formation trenches 22 are formed in the substrate 12 to define the fins 14. A recessed layer of insulating material 17 is positioned under the gate structure 16 and between the fins 14 in the areas outside of the gate structure, i.e., in the source/drain regions of the device 10. The gate structure 16 is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device 10. The fins 14 have a three-dimensional configuration: a height H, a width W and an axial length L. The axial length L corresponds to the direction of current travel in the device 10 when it is operational, i.e., the gate length direction of the device. The portions of the fins 14 covered by the gate structure 16 are the channel regions of the FinFET device 10. The gate structures 16 for such FinFET devices 10 may be manufactured using so-called "gate-first" or "replacement gate" (gate-last) manufacturing techniques. A FinFET device may have either a tri-gate or dual-gate channel region. For a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior FET structure as compared to that of a planar FET, especially in the 20 nm CMOS technology node and beyond.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time. Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in one or more additional stacked so-called "metallization layers" that are formed above the device level of the product. These metallization layers are typically comprised of layers of insulating material with conductive metal lines or conductive vias formed in the layers of material. Generally, the conductive lines provide the intra-level electrical connections, while the conductive vias provide the inter-level connections or vertical connections between different levels of metal lines. These conductive lines and conductive vias may be comprised of a variety of different materials, e.g., copper, with appropriate barrier layers, etc. The first metallization layer in an integrated circuit product is typically referred to as the "M1" layer, while the conductive vias that are used to establish electrical connection between the M1 layer and lower level conductive structures (explained more fully below) are typically referred to as "V0" vias. The conductive lines and conductive vias in these metallization layers are typically comprised of copper, and they are formed in layers of insulating material using known damascene or dual-damascene techniques.

FIG. 1B is a cross-sectional view of an illustrative integrated circuit product 30 comprised of a plurality of transistor devices 32 formed in and above a semiconductor substrate 33. FIG. 1c is a simplistic plan view of a single transistor device 32. These drawings depict a plurality of so-called "CA contact" structures 34 for establishing electrical connection to the simplistically depicted source/drain regions 36 of the device 32, and a gate contact structure 38, which is sometimes referred to as a "CB contact" structure, that is formed so as to establish electrical contact to the gate structure 40 of the transistor device. As shown in FIG. 1B, the CB gate contact 38 is typically positioned vertically above the isolation material 42 that surrounds the device 32, i.e., the CB gate contact 38 is typically not positioned above the active region, but it may be in some advanced architectures.

With reference to FIGS. 1B-1C, the transistors 32 comprise an illustrative gate structure 40, i.e., a gate insulation (dielectric) layer 40A and a gate electrode 40B, a gate cap 43, a sidewall spacer 44 and simplistically depicted source/drain regions 36. As noted above, the isolation region 42 has also been formed in the substrate 33 at this point in the process flow. At the point of fabrication depicted in FIG. 1B, layers of insulating material 50A, 50B, i.e., interlayer dielectric materials, have been formed above the substrate 33. Other layers of material, such as contact etch stop layers and the like, are not depicted in the attached drawings. Also depicted are illustrative raised epi source/drain regions 52 and source/drain contact structures 54 which typically include a so-called "trench silicide" (TS) structure 56. The CA contact structures 34 may be in the form of discrete contact elements, i.e., one or more individual contact plugs having a generally square-like shape (as shown in FIG. 1C) or cylindrical shape when viewed from above, that are formed in an interlayer dielectric material. In other applications (not shown in FIG. 1C), the CA contact structures 34 may also be a line-type feature that contacts underlying line-type features, e.g., the TS structure 56 that contacts the source/drain region 36 (the TS structure 56 is a line-type feature that typically extends across the entire active region on the source/drain region 36 in a the gate width direction of the device. The TS structures 56, CA contacts 34 and the CB contact 38 are all considered to be device-level contacts within the industry.

In one embodiment, the process flow of forming the TS structures 56, CA contacts 34 and CB contacts 38 may be as follows. After the first layer of insulating material 50A is deposited, TS openings are formed in the first layer of insulating material 50A that expose portions of underlying source/drain regions 36. Thereafter, a traditional metal silicide region is formed through the TS openings, followed by forming a metal, such as tungsten (not separately shown) on the metal silicide regions, and performing a chemical mechanical polishing (CMP) process down to the top of the gate cap layers 43. Then, the second layer of insulating material 50B is deposited and contact openings for the CA contacts 34 are formed in the second layer of insulating material 50B that expose portions of the underlying tungsten metallization above the source/drain regions 36. Next, while the opening for the CA contacts 34 is masked, the opening for the CB contact 38 is formed in the second layer of insulating material 50B and through the gate cap layer 43 so as to expose a portion of the gate electrode 40B. Typically, the CB contact 38 may be in the form of a round or square plug. Thereafter, the conductive CA contacts 34 and the conductive CB contact 38 are formed in their corresponding openings in the second layer of insulating material 50B by performing one or more common metal deposition and CMP process operations, using the second layer of insulating material 50B as a polish-stop layer to remove excess conductive material positioned outside of the contact openings. The CA contacts 34 and CB contact 38 typically contain a uniform body of metal, e.g., tungsten, and may also include one or more metallic barrier layers (not shown) positioned between the uniform body of metal and the layer of insulating material 50B. As noted above, the source/drain contact structures 54, the CA contacts 34 and the CB contact 38 are all considered to be device-level contacts within the industry.

With continuing reference to FIG. 1B, a portion of the multi-level metallization system for the IC product 30 is depicted. More specifically, FIG. 1B depicts an illustrative example of a so-called M1 metallization layer of the multi-level metallization system. The M1 metallization layer is formed in a layer of insulating material 60, e.g., a low-k insulating material. The M1 metallization layer typically includes a plurality of metal lines 62 that are routed as needed across the IC product 30. A plurality of conductive vias—so-called V0 vias 64—are formed so as to establish electrical connection between the M1 metallization layer and the device-level contacts—CA contacts 34 and the CB contact 38. The metallization lines 62 are typically formed by forming long continuous trenches in the layer of insulating material 60 across substantially the entire substrate. Thereafter, these trenches are filled with one or more conductive materials and one or more chemical mechanical polishing (CMP) processes are performed to remove excessive conductive materials outside of the trenches.

FIG. 1C is a simplistic plan view of the illustrative transistor device 32 just showing the device level contacts—the CA contacts 34 and the CB contact 38—and their relative locations for the device 32. Also depicted in FIG. 1C are a plurality of illustrative fins 65, the gate cap layer 43, the sidewall spacer 44 and the trench silicide structures 56 formed above the source/drain regions 36. As noted above, the entire CB gate contact 38 is positioned vertically above the isolation region 42 that surrounds the product 30, i.e., the CB gate contact 38 is typically not positioned above the active region. The CB gate contact 38 is typically positioned above the isolation region 42 so as to avoid or reduce the chances of creating an electrical short between the CB contact 38 and the TS structure 56, i.e., there is a minimum spacing 66 that must be maintained between these two structures according to various design rules in an attempt to prevent such electrical shorts. Unfortunately, there is an area penalty associated with the requirement that the CB contact 58 only be positioned above the isolation region 42.

Efforts have been made to create process flows whereby the CB contact 38 is formed entirely over the active area. Unfortunately, such process flows typically involve many additional process steps and may require the use of new materials. Such complex processing also inherently increases the chances of reduced product yields. What is needed is a less complex process flow for forming the CB contact 38 entirely over the active area.

The present disclosure is directed to various methods of forming a gate contact structure above an active region of a transistor and the resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a gate contact structure above an active region of a transistor and the resulting devices. One illustrative method disclosed includes, among other things, forming a gate above a semiconductor substrate, the gate comprising a gate structure and a gate cap positioned above the gate structure, forming a conductive source/drain metallization structure adjacent the gate in each of the source/drain regions and forming a recess in each of the conductive source/drain metallization structures. In this example, the method further includes forming a spacer structure that comprises recess filling portions that substantially fill the recesses and a portion that extends across the gate cap, wherein a portion of the gate cap is exposed within the spacer structure and wherein the recess filling portions have an upper surface, forming an insulating material within the spacer structure and on the exposed portion of the gate cap, forming a gate contact opening that exposes a portion of an upper surface of the gate structure and forming a conductive gate contact structure (CB) in the conductive gate contact opening, wherein the conductive gate contact structure (CB) is conductively coupled to the gate structure and wherein the conductive gate contact structure (CB) contacts the upper surfaces of the recess filling portions of the spacer structure.

One illustrative device disclosed herein includes, among other things, a gate positioned above a semiconductor substrate, the gate comprising a gate structure and a gate cap, first and second conductive source/drain metallization structures positioned adjacent and on opposite sides of the gate, each of the first and second conductive source/drain metallization structures having a front face and a recess defined in each of the conductive source/drain metallization structures. In this example, the device further includes a spacer structure comprising lower recess filling portions that substantially fill the recesses and an upper portion that extends across the gate cap, wherein a portion of the gate cap is exposed within the spacer structure and wherein the lower recess filling portions have an upper surface, an insulating material positioned within the spacer structure above the exposed portion of the gate cap and above the upper surfaces of the lower recess filling portions of the spacer structure, a gate contact opening that extends through the insulating material and the gate cap, the gate contact opening exposing a portion of an upper surface of the gate structure and at least a portion of the upper surfaces of the recess filling portions of the spacer structure and a conductive gate contact structure (CB) positioned in the conductive gate contact opening, wherein the conductive gate contact structure (CB) is conductively coupled to the gate structure and wherein the conductive gate contact structure (CB) contacts the upper surface of the recess filling portions of the spacer structure.

BRIEF DESCRIPTION OF THE DRAWINGS

The disclosure may be understood by reference to the following description taken in conjunction with the accompanying drawings, in which like reference numerals identify like elements, and in which:

FIG. 1A depicts an illustrative example of a prior art FinFET device;

FIGS. 1B-1C depict various illustrative prior art arrangements of device-level contacts and metallization layers for an integrated circuit product;

FIGS. 3A-3K depict other novel methods disclosed herein for methods of forming a gate contact structure for a transistor and the resulting devices; and FIGS. 4A-4M depict yet other novel methods disclosed herein for methods of forming a gate contact structure for a transistor and the resulting devices.

Figure 1C:
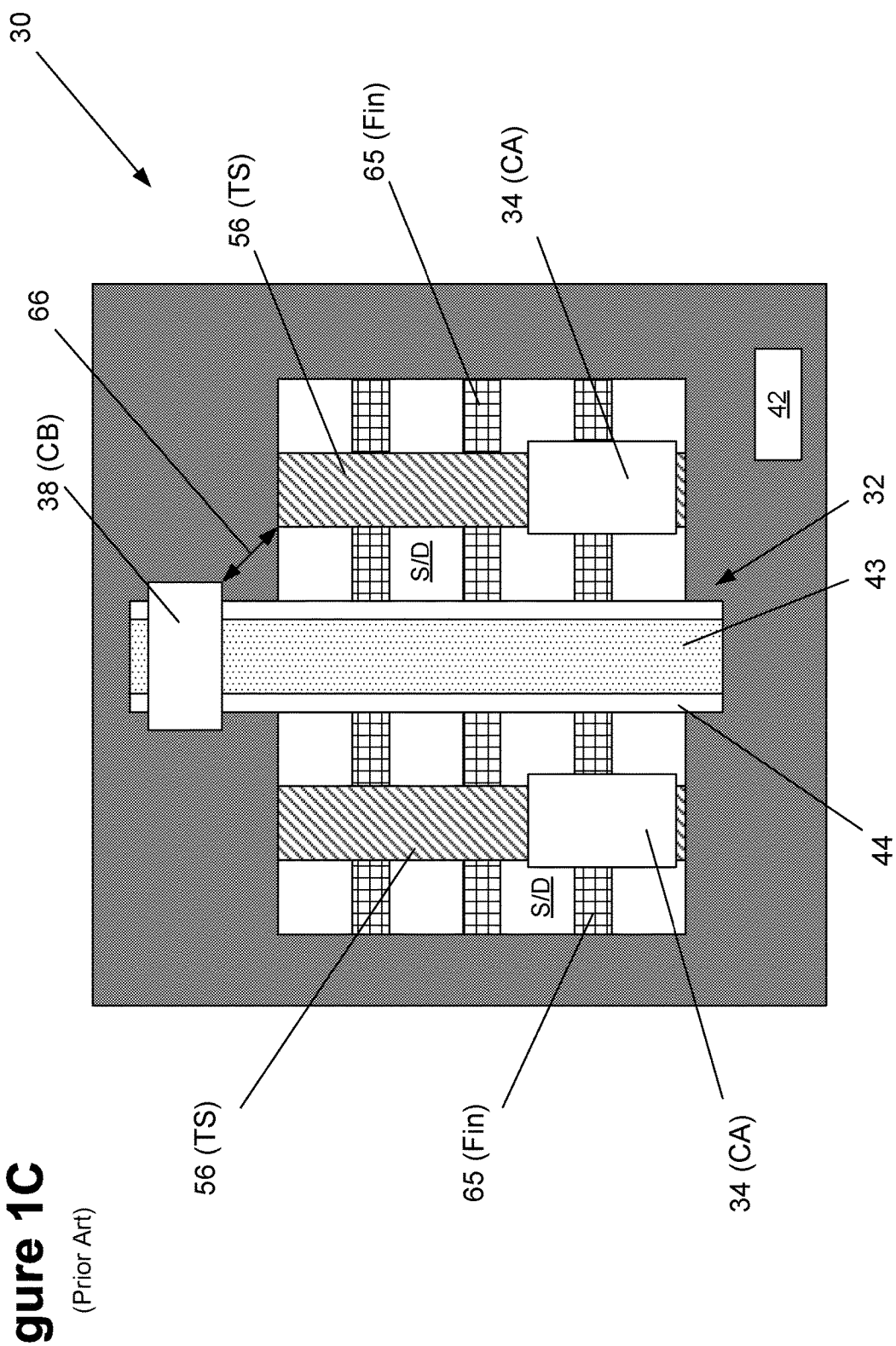

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a gate contact structure for a transistor and the resulting devices. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. The gate structures for such devices may be formed using either "gate first" or "replacement gate" manufacturing techniques. Thus, the presently disclosed inventions should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 2B:
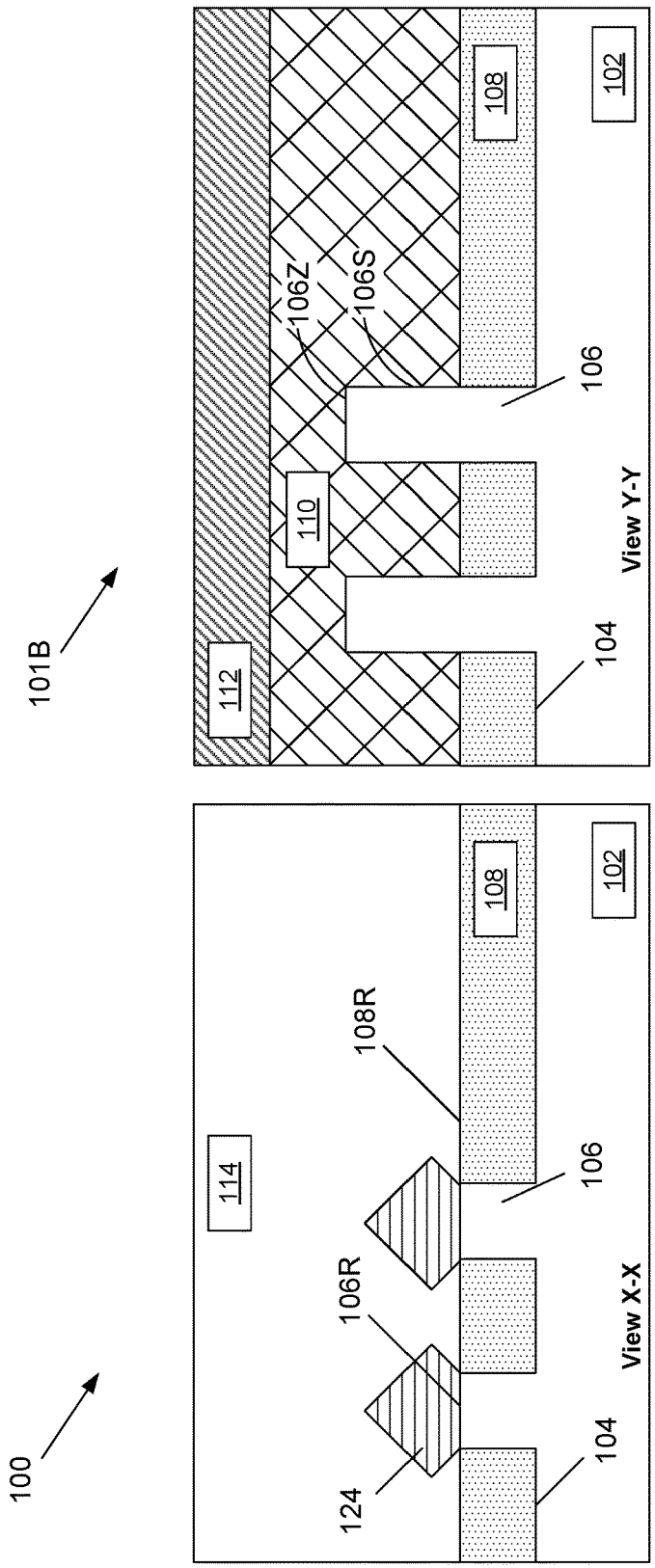
FIGS. 2A-2P depict various novel methods disclosed herein for methods of forming a gate contact structure for a transistor and the resulting devices.
Figure 2C:
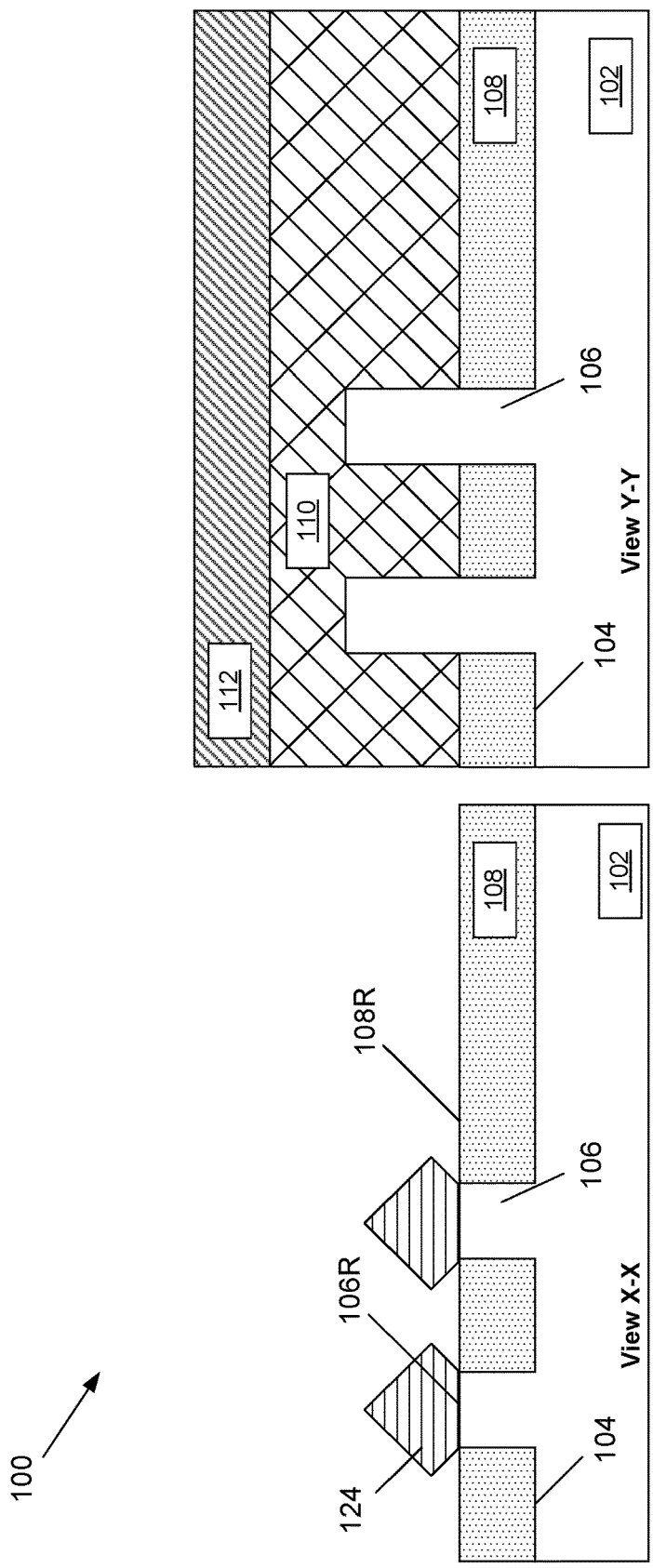
Figure 2D:
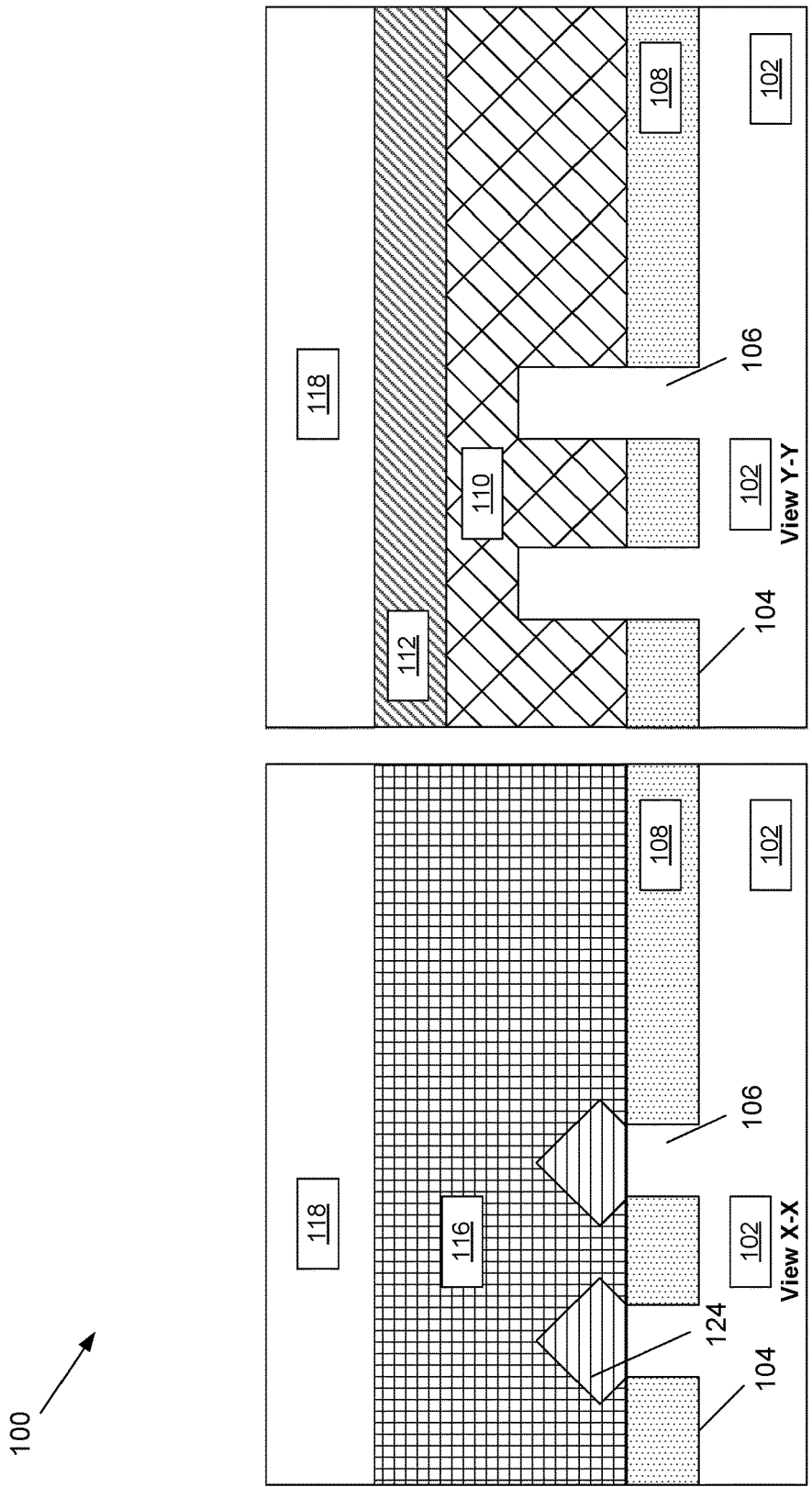
Figure 2E:
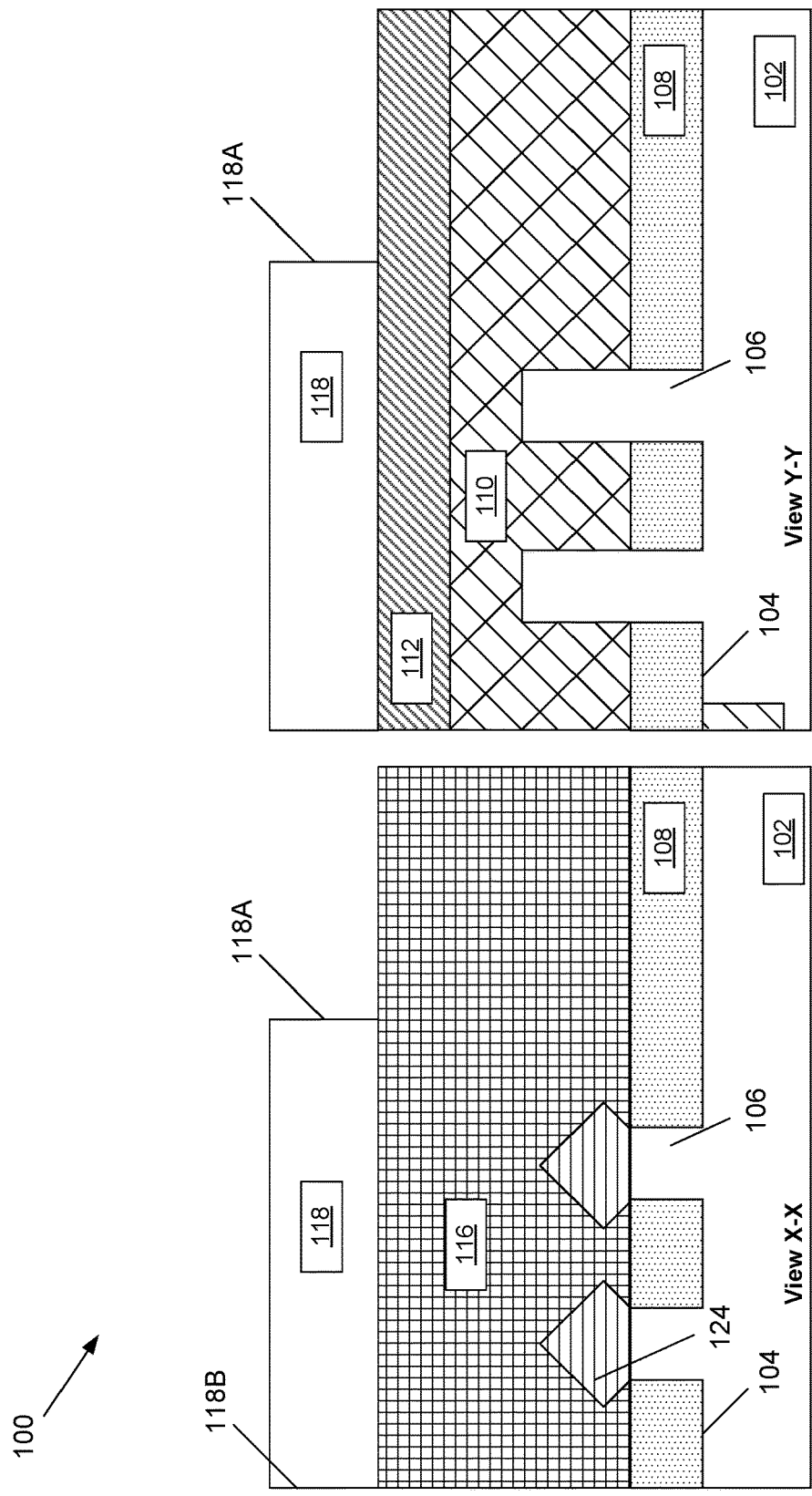
Figure 2F:
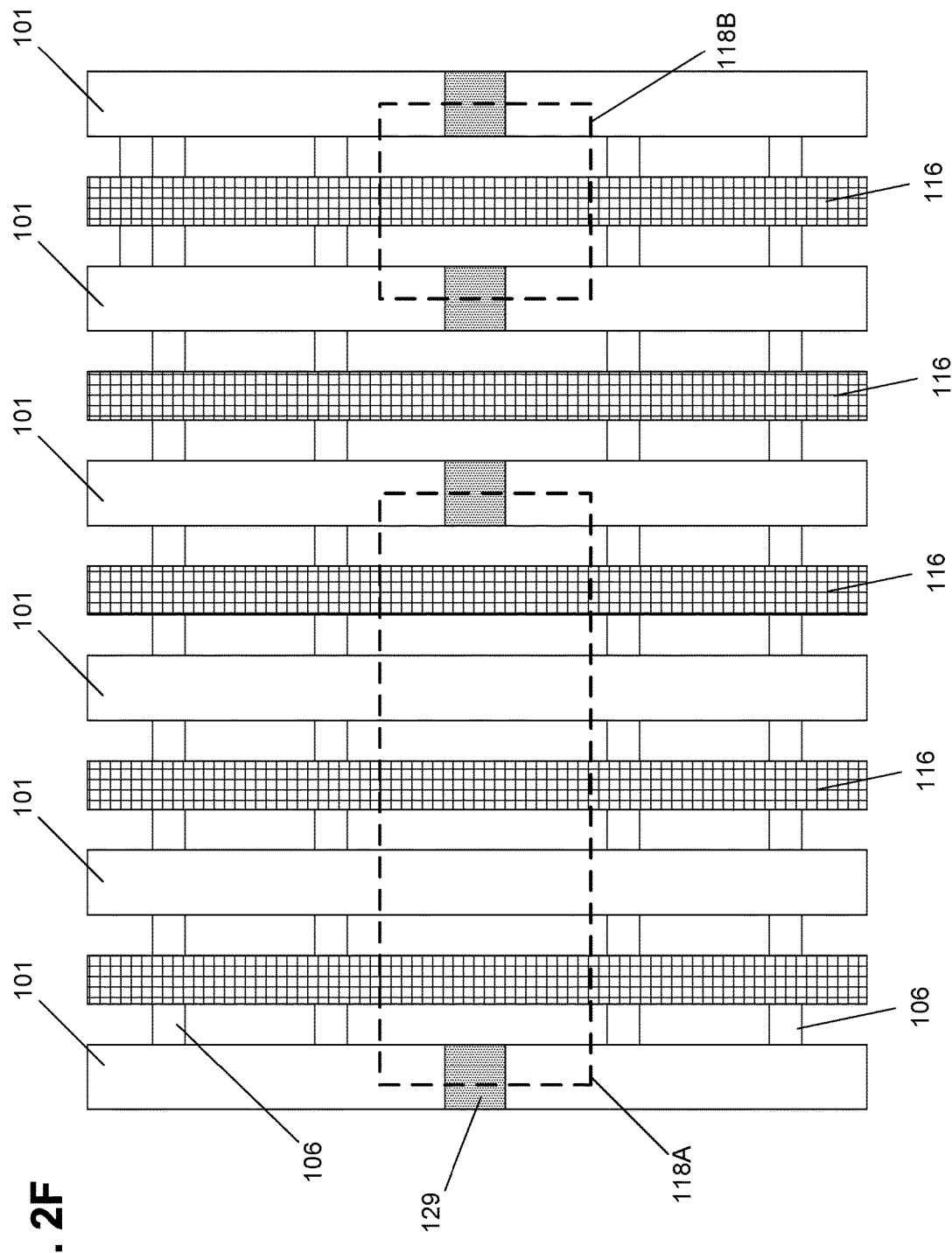
Figure 2G:
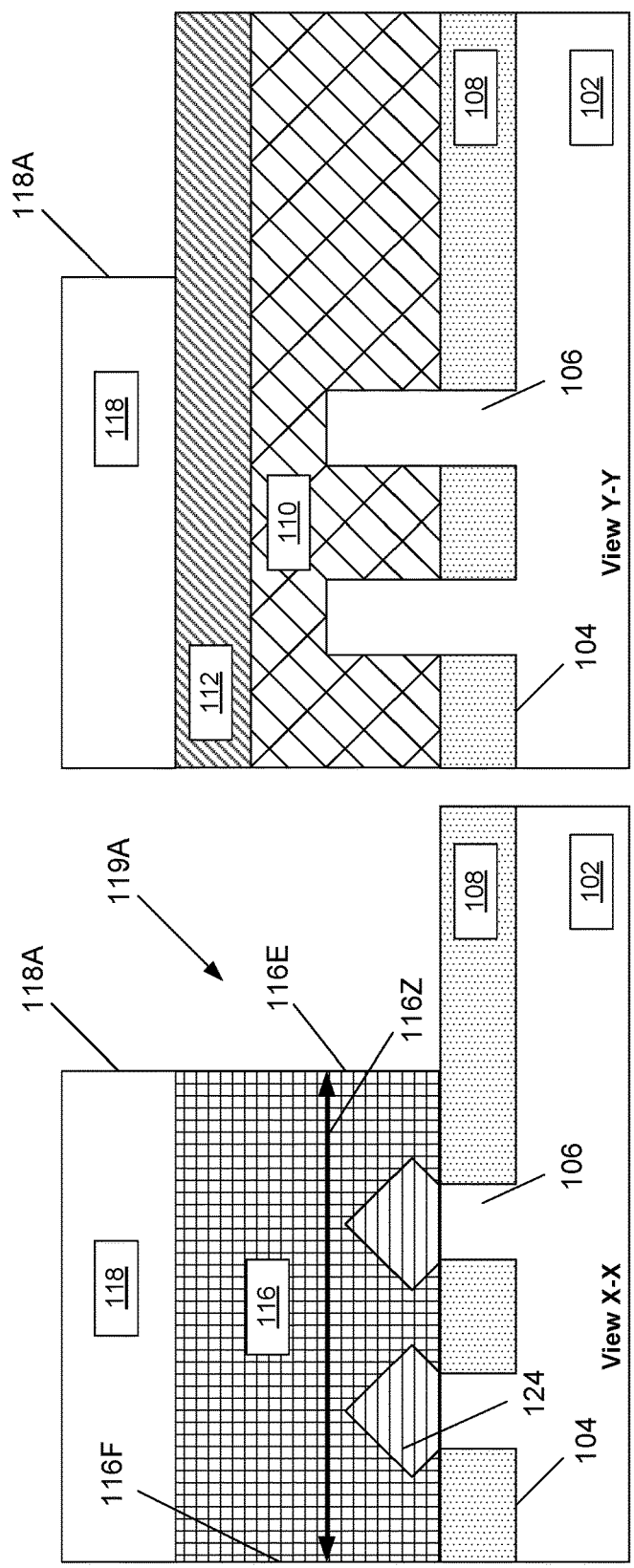
Figure 2H:
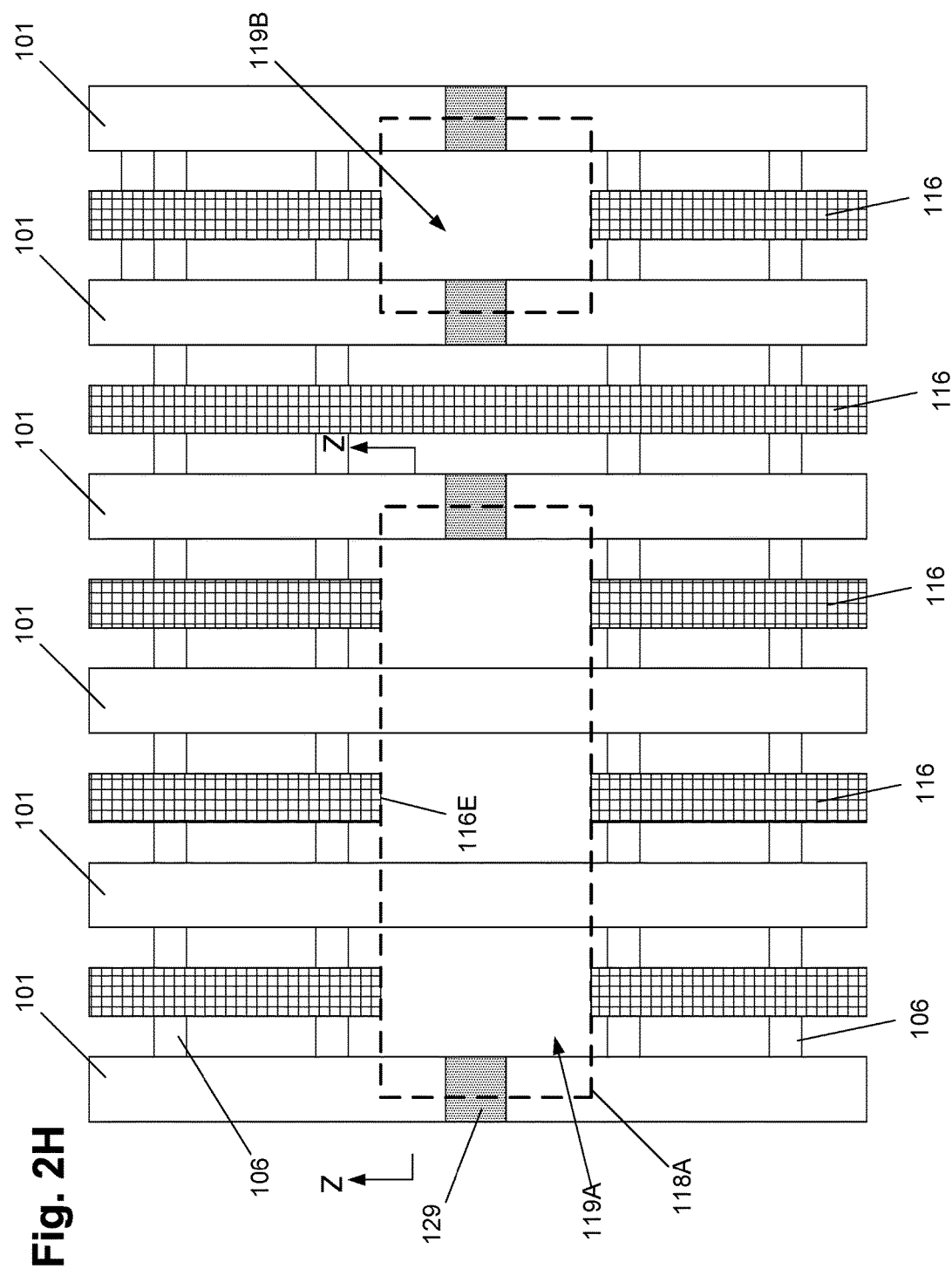
Figure 2K:
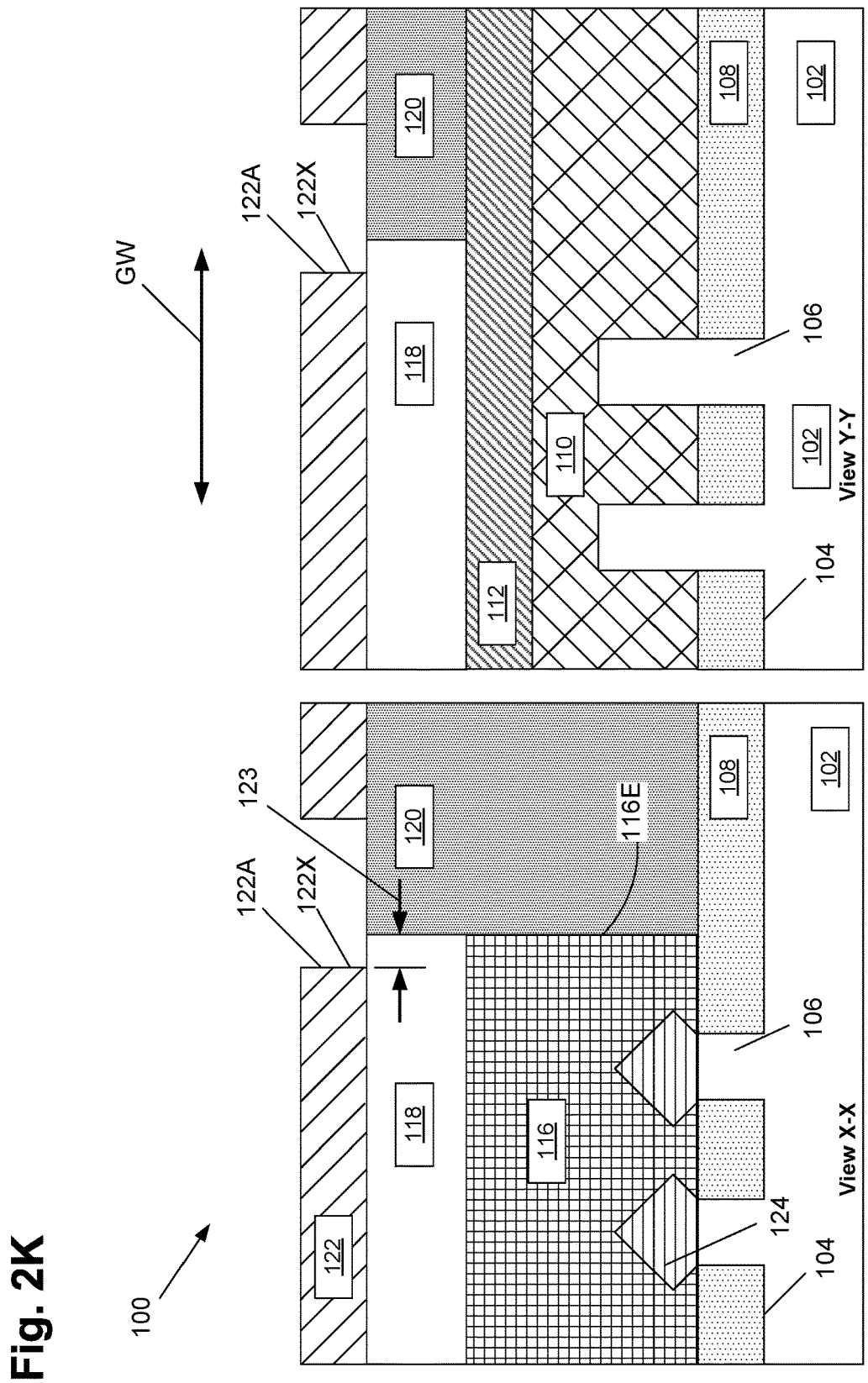
Figure 2L:
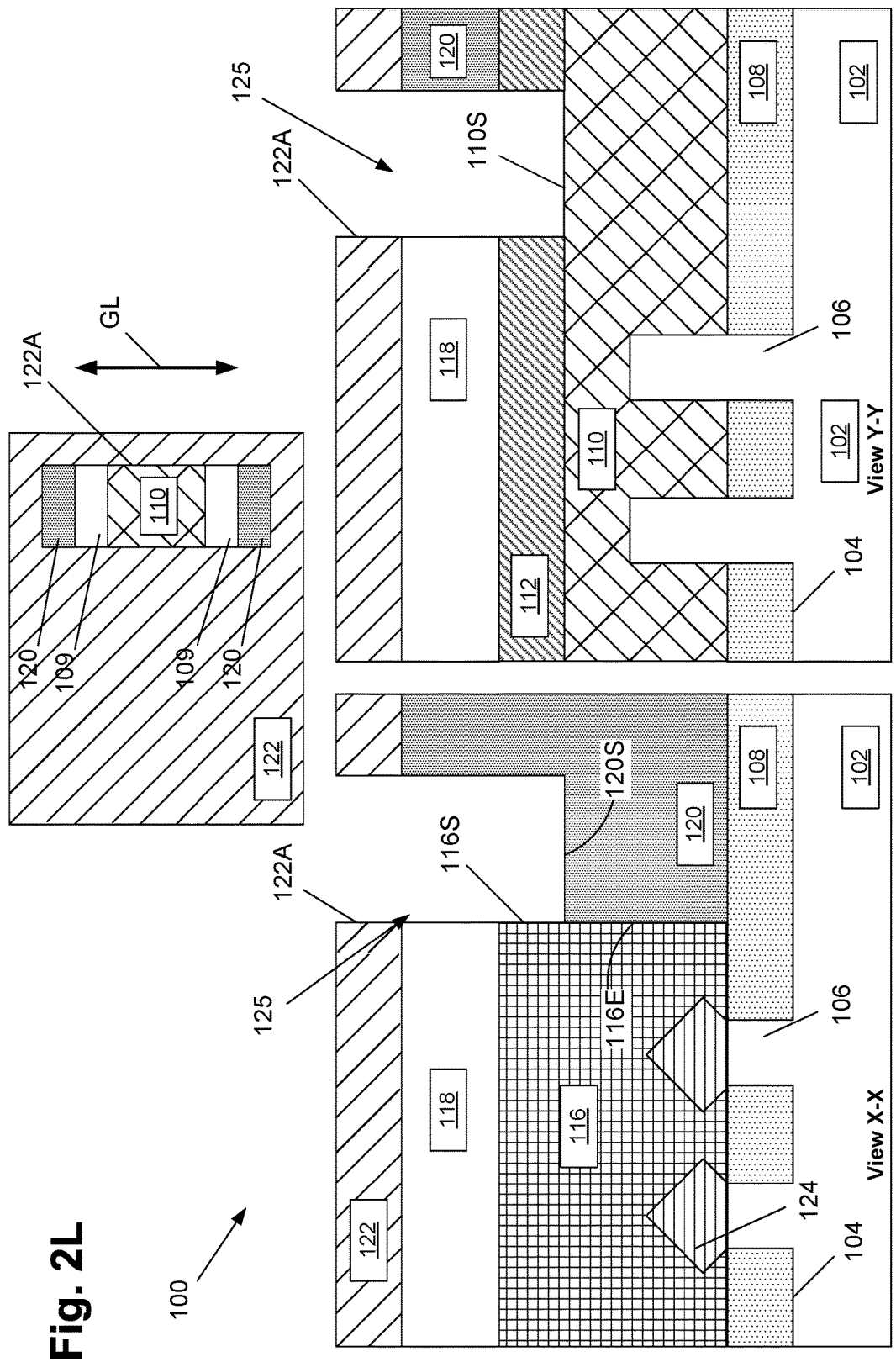
Figure 2M:
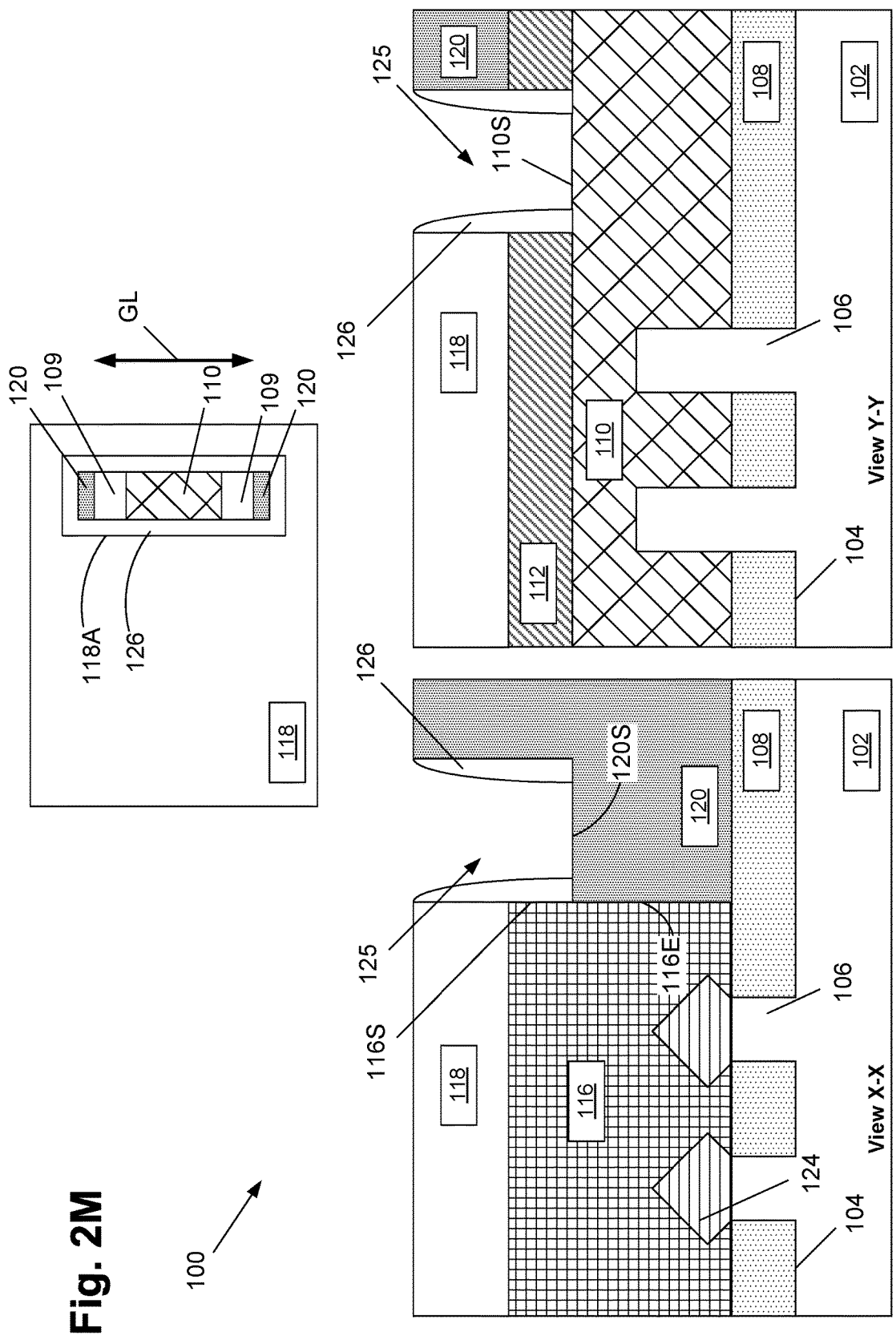
Figure 2O:
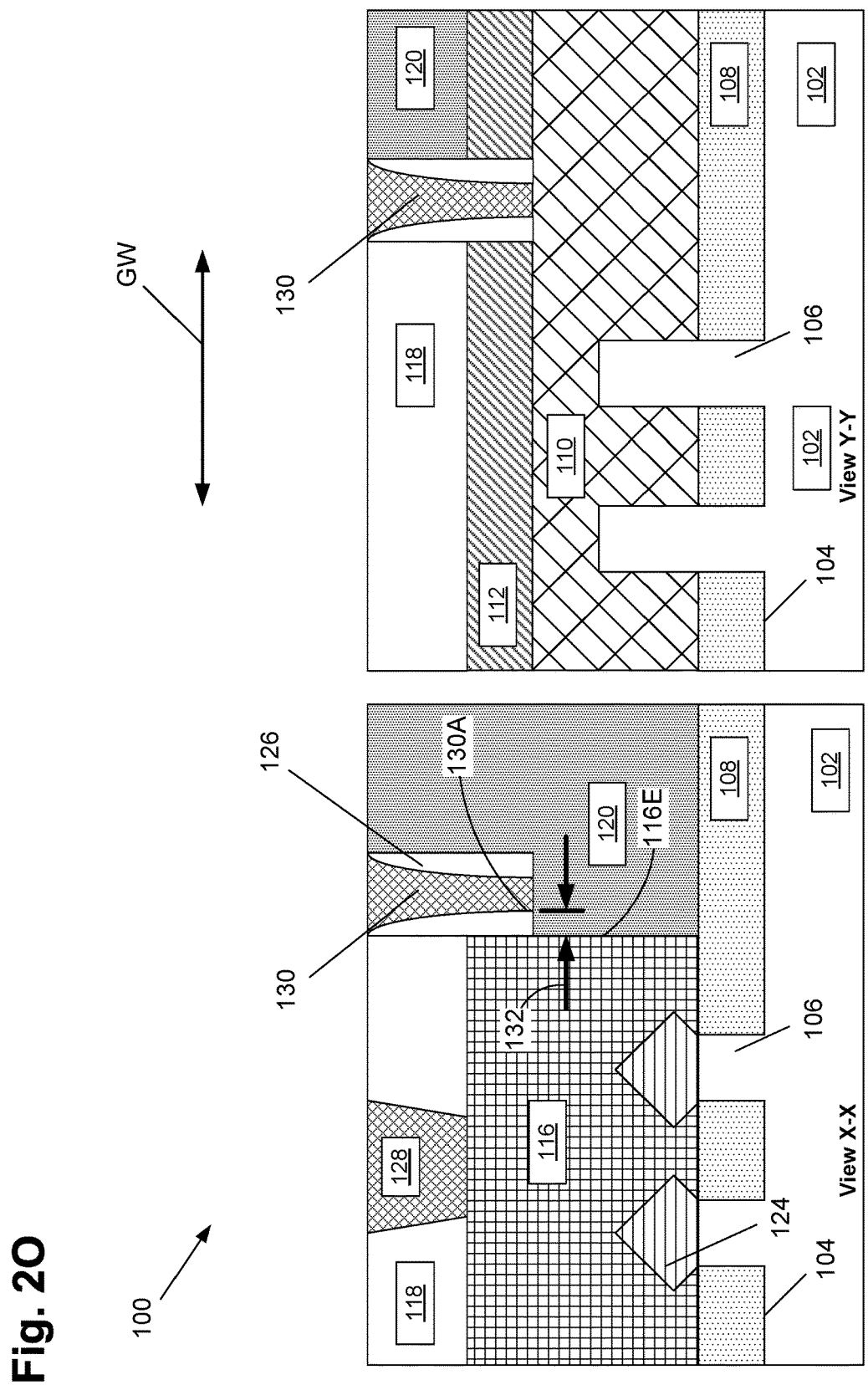
Figure 2P:
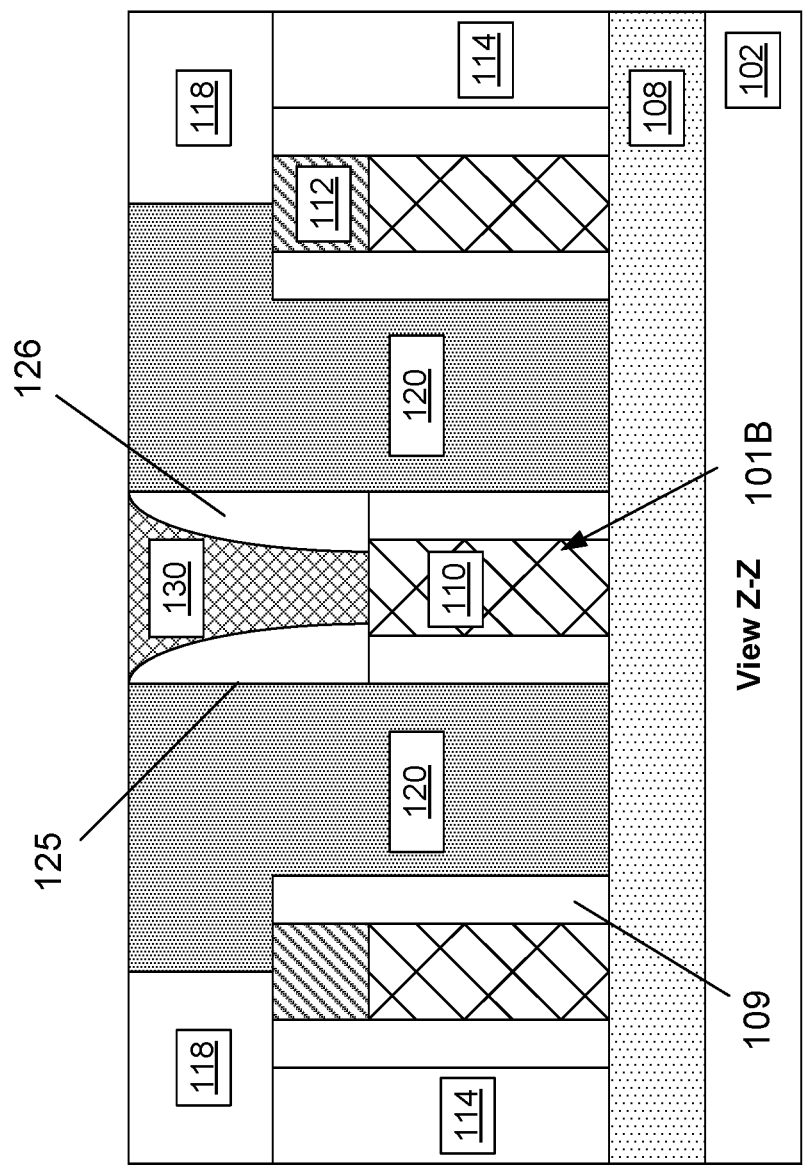

FIGS. 2A-2P depict various novel methods disclosed herein for methods of forming a gate contact structure (CB) for a transistor on an integrated circuit (IC) product 100. In the example depicted herein, the IC product 100 comprises three illustrative laterally spaced-apart gates 101A-C (collectively referenced using the numeral 101) that were formed above a semiconductor substrate 102. The product 100 may comprise either NMOS transistors, PMOS transistors or both types of transistors. The transistors may be of any desired configuration, e.g., FinFET devices, planar devices, etc. An illustrative FinFET device will be described and depicted in the present application for purposes of disclosing various aspects of the inventions disclosed herein. Additionally, various doped regions, e.g., source/drain regions, halo implant regions, well regions and the like, are not depicted in the attached drawings.

FIG. 2A depicts an example where an illustrative conductive gate contact structure (CB) will be formed very close to the active region 103 (depicted in a heavy dashed line). As used herein, the term "active region" should be understood to be the area or "footprint" occupied by the two conductive source/drain metallization structures 116 (not shown in FIG. 2A but described below) that will be formed on opposite sides of the gate 101B as well as the portion of the gate 101B itself that is positioned between the two conductive source/drain metallization structures 116. The conductive source/drain metallization structures 116 are electrically coupled to the source/drain regions 105 of the device. FIG. 2A also depicts a plurality of illustrative conductive source/drain contact structures (CA) that will eventually be formed above and contact the conductive source/drain metallization structures 116 positioned above the source/drain regions 105. FIG. 2A is a simplistic plan view showing where various cross-sectional views are taken in the drawings. As indicated in FIG. 2A, the view X-X is a cross-sectional view taken through one of the source/drain regions 105 of the device (in a direction corresponding to the gate width (GW) direction of the device). Note that the view X-X extends through a location where the illustrative conductive source/drain contact structures (CA) will eventually be formed. The view Y-Y is a cross-sectional view taken through the long axis of the gate 101B (in a direction corresponding to the gate width direction of the device). Note that the view Y-Y extends through a location where the conductive gate contact structure (CB) will eventually be formed. It should also be noted that the plan view shown in FIG. 2A of the product 100 is provided for reference purposes only and it is not intended to show the processing and structural details shown in the cross-sectional views so as to not overly complicate the drawings.

The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

FIGS. 2A and 2B depict the product 100 at a point in fabrication wherein several process operations have been performed. First, with reference to FIG. 2B, one or more etching processes, e.g., anisotropic etching processes, were performed through a patterned fin-formation etch mask (not shown) to form a plurality of fin-formation trenches 104 in the substrate 102 and thereby define a plurality of fins 106. The fins 106 are not shown in the plan view in FIG. 2A. The patterned fin-formation hard mask may be comprised of one or more layer of materials and it may be formed to any desired overall thickness, e.g., the patterned fin-formation hard mask may be comprised of a relatively thin layer of silicon dioxide and a relatively thicker layer of silicon nitride. The patterned fin-formation hard mask may be formed by depositing the layer or layers of material of the patterned fin-formation hard mask above the upper surface of the substrate 102 and thereafter patterning those layers of material using known photolithography and etching techniques.

With continuing reference to FIG. 2B, the width and height of the fins 106 may vary depending upon the particular application. Additionally, the overall size, shape and configuration of the fin-formation trenches 104 and fins 106 may vary depending on the particular application. In the illustrative examples depicted in the attached drawings, the fin-formation trenches 104 and the fins 106 are all depicted as having a uniform size and shape. However, such uniformity in the size and shape of the trenches 104 and the fins 106 is not required to practice at least some aspects of the inventions disclosed herein. In the attached figures, the fin-formation trenches 104 are depicted as having been formed by performing an anisotropic etching process that results in the fins 106 having a schematically (and simplistically) depicted, generally rectangular configuration. In an actual real-world device, the sidewalls of the fins 106 may be somewhat outwardly tapered (i.e., the fins may be wider at the bottom of the fins than they are at the top of the fins) although that configuration is not depicted in the attached drawings. Thus, the size and configuration of the trenches 104 and the fins 106, and the manner in which they are made, should not be considered a limitation of the present invention. For ease of disclosure, only the substantially rectangular trenches 104 and fins 106 will be depicted in the subsequent drawings. Moreover, the FinFET device may be formed with any desired number of fins 106. In the example depicted herein, the FinFET device will be depicted as being comprised of two illustrative fins 106. As initially formed, the fins 106 comprise opposing lateral sidewalls 106S and an upper surface 106Z.

Still referencing FIG. 2B, a layer of insulating material 108 (e.g., silicon dioxide) was then deposited so as to overfill the fin-formation trenches 104 and, thereafter, at least one process operation, such as a chemical mechanical polishing (CMP) process, was performed to planarize the upper surface of the layer of insulating material 108 with the upper surface 106Z of the fins 106, thereby removing the patterned fin-formation hard mask. Next, a recess etching process was performed on the layer of insulating material 108 such that it has a recessed upper surface 108R that exposes a desired amount of the fins 106 above the recessed upper surface 108R.

Still with reference to FIG. 2B, after the layer of insulating material 108 was recessed, the gates 101 were formed above the fins 106. Each of the gates 101 includes the schematically depicted gate structure 110, a sidewall spacer 109 (see FIG. 2A) and a gate cap 112. The gate structure 110 cover a portion of the fins 106 that will become the channel region of the device during operation. The gate structure 110 may be a final gate structure (a gate-first manufacturing process) or it may be a sacrificial gate structure (for a replacement gate manufacturing process). The gate structure 110 may be comprised of a gate insulation layer (not separately shown), e.g., silicon dioxide or a high-k material having a dielectric constant greater than 10, and a gate electrode comprised of one or more layers of conductive material (not separately shown), e.g., metal-containing materials. The sidewall spacer 109 (see FIG. 2A) was formed by performing a conformal deposition process to form a conformal layer of spacer material, e.g., silicon nitride, above the substrate 102 and thereafter performing an anisotropic etching process. The sidewall spacer 109 and the gate cap layer 112 are typically comprised of silicon nitride. Of course, those skilled in the art will appreciate that, in some applications, one or more of the gates 101A-C may span across several spaced-apart active regions 103 that are separated by isolation material. In the view depicted in FIG. 2A, the gate 101B is the "active gate" for the active transistor device that is formed above the active region 103, while the gates 101A and 101C serve as so-called dummy gates. In a real-world IC product 100, there may be many active gates and/or dummy gates formed across a single active region 103. Thus, the subject matter disclosed herein should not be considered to be limited to the simplistic examples depicted herein.

Next, as shown in view X-X of FIG. 2B, the portions of the fins 106 in the source/drain regions 105 of the device were recessed such that they have a recessed upper surface 106R that is approximately level with the recessed upper surface 108R of the layer of insulating material 108. Thereafter, regions of epi semiconductor material 124 were formed on the recessed fins in the source/drain regions 105 of the transistor device. Also depicted in FIG. 2B is a layer of insulating material 114, e.g. silicon dioxide that was deposited above the substrate 102 between the laterally spaced-apart gates 101. Other layers of material that may be present, such as a conformal contact etch stop layer that is formed above the epi material 124, are not depicted in the drawings so as to not overly complicate the drawings.

FIG. 2C depicts the product 100 after several process operations were performed. First, an etching process was performed to selectively remove the layer of insulating material 114 relative to the surrounding materials. This etching process was performed without forming a patterned etch mask above the layer of insulating material 114 because the removal of the insulating material 114 is self-aligned wherein the insulating material 114 may be selectively removed relative to the sidewall spacer 109 and the gate cap 112 of the gates 101. The removal of the layer of insulating material 114 exposes the epi material 124 formed on the recessed fins 106 in the source/drain regions 105 (as well as other areas above the substrate 102). Note that the recessed layer of insulating material 108 remains in position after this etching process is completed. Also note that, in one illustrative process flow, a relatively thin conformal etch stop layer of silicon nitride (not shown) may be formed on the product prior to the formation of the layer of insulating material 114. The etch stop layer may also serve to protect the insulating material 108 as the insulating material 114 is being removed. Thereafter, exposed portions of the etch stop layer may be selectively removed relative to the insulating material 108 and the epi material 124 so as to thereby expose the epi material 124 in the source/drain regions of the device.

FIG. 2D depicts the product after several process operations were performed. First, conductive source/drain metallization structures 116 (comprised of, in this example, silicide and at least one conductive material) were formed above the source/drain regions 105 and between the adjacent gates 101 so as to enable electrical contact with each of the individual source/drain regions 105 of the devices. As depicted, the conductive source/drain metallization structures 116 are conductively coupled to the epi material 124. The conductive source/drain metallization structures 116 will eventually be conductively coupled to the conductive source/drain contact structures (CA) that are to be subsequently formed on the product 100.

In one illustrative process flow, a pre-clean process may be performed prior to forming metal silicide regions (not shown) that physically contacts the epi material 124. Thereafter, the conductive materials for the formation of the remaining portion of the conductive source/drain metallization structures 116 are formed as long continuous lines that extend between the gates 101 across the entire substrate 102. In some cases, the conductive source/drain metallization structures 116 comprise a trench metal silicide material (not separately shown) that is formed on and in contact with the epi material 124, and a metal material or metal-containing line, such as tungsten (not separately shown), that is formed on and in contact with the trench metal silicide material. After the formation of the materials that make up the conductive source/drain metallization structures 116, a chemical mechanical polishing (CMP) process was performed to remove excess materials located above the upper surface of the gate caps 112. As noted above, the conductive source/drain metallization structures 116 including the epi material 124 (irrespective of their precise configuration and the manner in which they are made) provide an electrical path between the source/drain regions 105 of the device and the conductive source/drain contact structures (CA) that are to be subsequently formed for the product 100. With continuing reference to FIG. 2D, a layer of insulating material 118, e.g., silicon dioxide, was then deposited on the product.

FIG. 2E (cross-sectional side views) and FIG. 2F (plan view) depict the product 100 after the layer of insulating material 118 was patterned so as to define a plurality of S/D metallization cut openings 118A, 118B (only 118A is shown in FIG. 2E) in the layer of insulating material 118. FIG. 2F is a simplistic plan view that depicts the location of the metallization cut openings 118A, 118B (in dashed lines) relative to a plurality of gates 101 and a plurality of conductive source/drain metallization structures 116. A plurality of fins 106 are also depicted in FIG. 2F. In this example, some of the gates 101 were previously cut and the gate-cut opening was filled with a silicon nitride material 129. As shown in FIG. 2F, the S/D metallization cut openings 118A, 118B expose portions of the conductive source/drain metallization structures 116 that are desired to be removed so as to thereby leave and define cut and discrete conductive source/drain metallization structures 116 positioned above the source/drain regions 105. The S/D metallization cut openings 118A, 118B also expose a portion of the gate caps 112 and the sidewall spacers 109 positioned adjacent the gate structure 110. The layer of insulating material 118 was patterned by forming a patterned etch mask (not shown) above the layer of insulating material 118 and thereafter performing an etching process through the patterned etch mask.

FIG. 2G (cross-sectional side views) and FIG. 2H (plan view) depict the product 100 after an substantially anisotropic etching process was performed through the patterned layer of insulating material 118 to remove the exposed portions of the conductive line portion of the conductive source/drain metallization structures 116 relative to the surrounding materials. As shown in view X-X in FIG. 2G, this process operation cuts the conductive line portion of the conductive source/drain metallization structures 116 to a desired axial length 116Z (in the gate width direction) that has a front cut surface 116E and a rear cut surface 116F. As noted above, the axial length 116Z of the conductive source/drain metallization structures 116 defines the dimension of the active region 103 in the gate width (GW) direction of the device. This process also defines a plurality of openings 119A adjacent the front cut face 116E that exposes portions of the recessed layer of insulating material 108.

From this point forward, all that will be depicted is the processing associated with forming the gate contact structure adjacent or near the front cut face 116E of the conductive source/drain metallization structures 116. FIG. 2I depicts the product 100 after several process operations were performed. First, an insulating material 120, e.g. SiCO, SiC, was deposited above the layer of insulating material 118 so as to over-fill the opening 119A (and other openings defined by cutting the conductive line portion of the conductive source/drain metallization structures 116). A planarization process (e.g., a chemical mechanical planarization (CMP) process) was performed on the insulating material 120 using the patterned layer of insulating material 118 as a polish-stop. In this embodiment, the insulating material 120 contacts substantially the entire front cut surface 116E of the conductive source/drain metallization structures 116. Also note that a portion of the insulating material 120 is positioned above the gate cap 112, as shown in the view Y-Y. The insulating material 120 should be a material that exhibits good etch selectivity relative to the layer of insulating material 118 and the gate cap 112.

FIG. 2J depicts the product 100 after a patterned CB etch masking layer 122, e.g., OPL, photoresist, etc., was formed above the product 100. The CB etch masking layer 122 has a gate contact opening 122A defined therein that corresponds to the location where a gate contact structure will be formed. FIG. 2J depicts the illustrative example, wherein the gate contact opening 122A is perfectly aligned or positioned (in the gate width (GW) direction) above the desired contacting point of the gate structure 110. That is, as shown in the view X-X, the edge 122X of the gate contact opening 122A is substantially vertically aligned with the front cut face 116E of the conductive source/drain metallization structures 116, wherein the front cut face 116E defines the beginning edge of the active region 103 of the device. As depicted the "front" cut face is the edge of the conductive source/drain metallization structures 116 that will be laterally closest to the gate contact structure (CB) after it is formed. By moving the location of the gate contact opening 122A and ultimately the gate contact structure (CB) laterally closer (in the gate width direction) to the conductive source/drain metallization structures 116, area savings may be achieved and cell heights may be scaled, even if the entire gate contact structure (CB) is not positioned entirely above the active region 103. Thus, area savings may be achieved using the novel methods disclosed herein which are less complex than processing schemes involved in forming a gate contact structure (CB) entirely above an active region 103 of a device.

The methods disclosed herein also allow for some misalignment when forming the gate contact structure (CB). FIG. 2K depicts an illustrative example wherein the edge 122X of the gate contact opening 122A is somewhat misaligned (in the gate width (GW) direction) above the desired contacting point of the gate structure 110, as reflected by the offset dimension 123. Stated another way, the edge 122X of the opening 122A is positioned above the active region 103 and is offset axially from the front cut face 116E of the conductive source/drain metallization structures 116 by the distance 123. The distance 123 may vary depending upon the particular application, e.g., 0-6 nm. As depicted, with the gate contact opening 122A in such a misaligned position, as shown in FIG. 2K, portions of both the layers of insulating material 118 and 120 are exposed by the gate contact opening 122A.

In the illustrative process flow depicted herein, the next major processing operation will involve the formation of a plurality of illustrative conductive source/drain contact structures (CA) and a conductive gate contact structure (CB). In the illustrative process flow depicted herein, the opening for the conductive gate contact structure (CB) will be formed prior to the formation of the openings for conductive source/drain contact structures (CA). However, as will be appreciated by those skilled in the art after a complete reading of the present application, this order of processing could be reversed if desired.

Accordingly, FIG. 2L depicts the product 100 after at least one etching process was performed through the opening 122A in the patterned CB masking layer 122 to define a CB contact opening 125 in the insulating material 120 that exposes an upper surface 110S of the gate structure 110. As depicted, the at least one etching process removes a portion of the insulating material 120, a portion of the gate cap 112 and a vertical portion of the sidewall spacer 109 (by an amount that is roughly equivalent to the thickness of the gate cap 112). The layer of insulating material 118 is not attacked (to any appreciable extent) during this etching process. Also note that a portion 116S of the front cut face 116E of the conductive source/drain metallization structures 116 is exposed by formation of the gate contact opening 125 and that the insulating material 120 positioned in contact with the front face 116E of the conductive source/drain metallization structures 116 now has a recessed surface 120S.

FIG. 2M depicts the product after an internal insulating sidewall spacer 126 was formed inside the gate contact opening 125, i.e., on the entire inner perimeter of the gate contact opening 125. The internal spacer 126 may be comprised of a variety of different materials, e.g., silicon nitride, SiON, SiOCN, SiCO, SiBCN, etc., and it may be formed to any desired thickness or width at its base. The internal spacer 126 may be formed by performing a conformal deposition process to form a conformal layer of spacer material across the product and in the gate contact opening 125 and thereafter performing an anisotropic etching process on the layer of spacer material. Note that the internal spacer 126 covers the previously exposed surface 116S of the front cut face 116E of the conductive source/drain metallization structures 116 but leaves a portion of the surface 110S of the gate structure 110 exposed. The formation of the internal spacer 126 will have the effect of reducing the size of the gate contact opening 125 to a degree, but this reduction in size can be accounted for when initially forming the gate contact opening 125.

FIG. 2N depicts the product 100 after several process operations were performed to form final CA contact structures 128 and a final CB contact structure 130 for the product 100. First, the patterned CB masking layer 122 was removed. Thereafter, a patterned CA contact etch mask (not shown), e.g., OPL, with openings formed therein that correspond to the location where the CA contact structures 128 will be formed, was formed above the layer of insulating material 118. At this point, the patterned CA contact etch mask fills the previously formed gate contact opening 125. Thereafter, an etching process was performed through the CA contact etch mask to define a plurality of CA contact openings 127 in the layer of insulating material 118. The CA contact openings 127 expose portions of the underlying conductive source/drain metallization structures 116. At that point, the CA contact etch mask was removed. Then, one or more conductive materials (perhaps including one or more barrier layers) was formed in the CA contact openings 127 and in the CB contact opening 125 at the same time so as to over-fill the openings 127, 125 with conductive materials. Thereafter, one or more planarization processes (e.g., a chemical mechanical planarization (CMP) process) was performed using the insulating materials 118, 120 a polish-stop, thereby removing excess portions of the conductive material positioned above the upper surfaces of the insulating materials 118, 120. Note that the CB contact structure 130 is surrounded and contacted by the internal spacer 126 within the initial gate contact opening 125. Also note that, in this embodiment, the entirety of the spacer 126 is positioned within the gate contact opening 125.

The CA contact structures 128 and the CB contact structure 130 depicted herein are intended to be schematic and representative in nature, as they may be formed using any of a variety of different conductive materials. Note that, in the depicted example, where the outer edge 126X of the internal spacer 126 is substantially aligned with the front cut face 116E of the conductive source/drain metallization structures 116, the edge 130A of the final CB contact structure 130 closest to the conductive source/drain metallization structures 116 is axially offset (in the gate width direction of the device) from the front cut face 116E of the conductive source/drain metallization structures 116 by a distance 132 (e.g., 4-8 nm), which approximately corresponds to the thickness of the spacer 126 at its base. Also note that an electrical short between the conductive source/drain metallization structures 116 and the final CB contact structure 130 is prevented by the presence of the internal spacer 126.

FIG. 2O depicts the formation of the CA contact structures 128 and the final CB contact structure 130 for the product 100 in the case where the gate contact opening 122A is somewhat misaligned, as shown in FIG. 2K. Such misalignment has the effect of reducing the dimension of the gate contact structure (CB) 130 in the direction corresponding to the gate width direction of the device.

FIG. 2P is a new cross-sectional view Z-Z that is taken where indicated in FIG. 2H to show further novel aspects of an integrated circuit product shown in FIG. 2N that was formed using the methods disclosed herein. As indicated, the view Z-Z is taken through the opening 119A where the gate contact opening 125 and the gate contact structure 130 will eventually be formed. FIG. 2P depicts the product just after the formation of the CA contact structures 128 and the final CB contact structure 130. At the point of processing depicted in FIGS. 2N-2P, the product 100 may be completed by performing traditional manufacturing techniques.

Figure 3B:
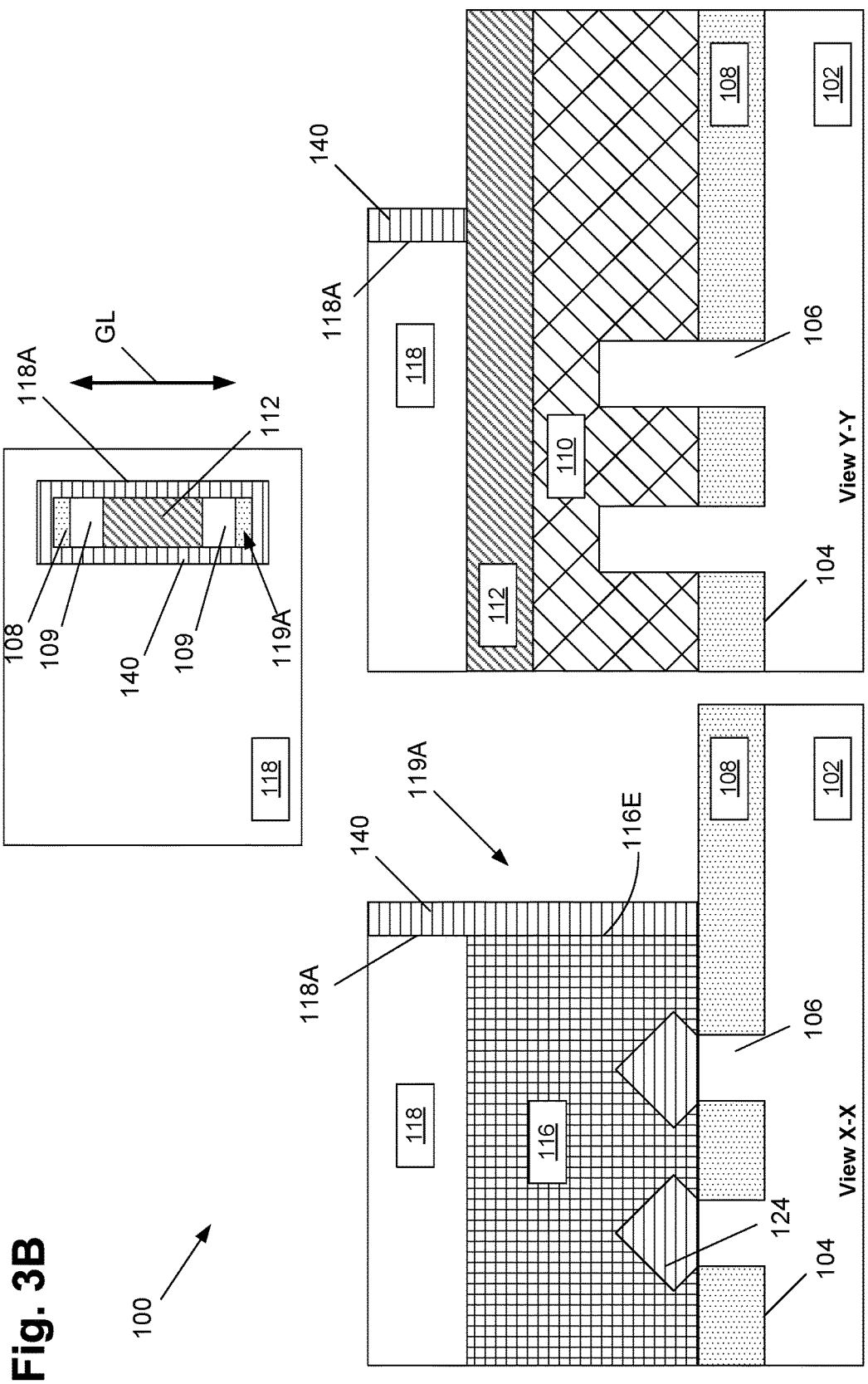

FIGS. 3A-3K depict other novel methods disclosed herein for methods of forming a gate contact structure 130 for a transistor and the resulting devices. FIG. 3A depicts the device at a point in processing that corresponds to that shown in FIG. 2G, i.e., after the conductive source/drain metallization structures 116 were cut to the desired axial length 116Z thereby defining the opening 119A that exposes the layer of insulating material 108. The entirety of the front cut face 116E of the conductive source/drain metallization structures 116 is exposed within the opening 119A.

FIG. 3B depicts the product after an internal insulating sidewall spacer 140 was formed in the opening 119A and the opening 118A above the gate cap 112. The internal spacer 140 may be comprised of a variety of different materials, e.g., e.g. SiCO, SiC, SiON, SiOCN, SiCO, SiBCN etc., and it may be formed to any desired thickness or width at its base. The internal spacer 140 may be formed by performing a conformal deposition process to form a conformal layer of spacer material across the product and in the openings 119A and 118A and thereafter performing an anisotropic etching process on the layer of spacer material. Note that, in this illustrative process flow, the internal spacer 140 covers the entirety of the previously exposed front cut face 116E of the conductive source/drain metallization structures 116 positioned on opposite sides of the gate 101B.

FIG. 3C depicts the product after a layer of insulating material 112A (e.g., silicon nitride) was then deposited so as to overfill the various openings (including the opening 119A) and, thereafter, at least one process operation, such as a chemical mechanical polishing (CMP) process, was performed to planarize the upper surface of the layer of insulating material 112A with the upper surface of the patterned layer of insulating material 118. In one illustrative embodiment, the layer of insulating material 112A may be comprised of the same material as that of the gate cap 112, e.g., silicon nitride. Note that the insulating material 112A is formed within the spacer 140, i.e., the outer sidewalls of the insulating material 112A contact the internal spacer 140, i.e., the insulating spacer 140 completely surrounds the outer sidewalls of the insulating material 112A.

FIG. 3D depicts the product after the above-described patterned CB etch masking layer 122 was formed on the product 100.

Figure 3E:
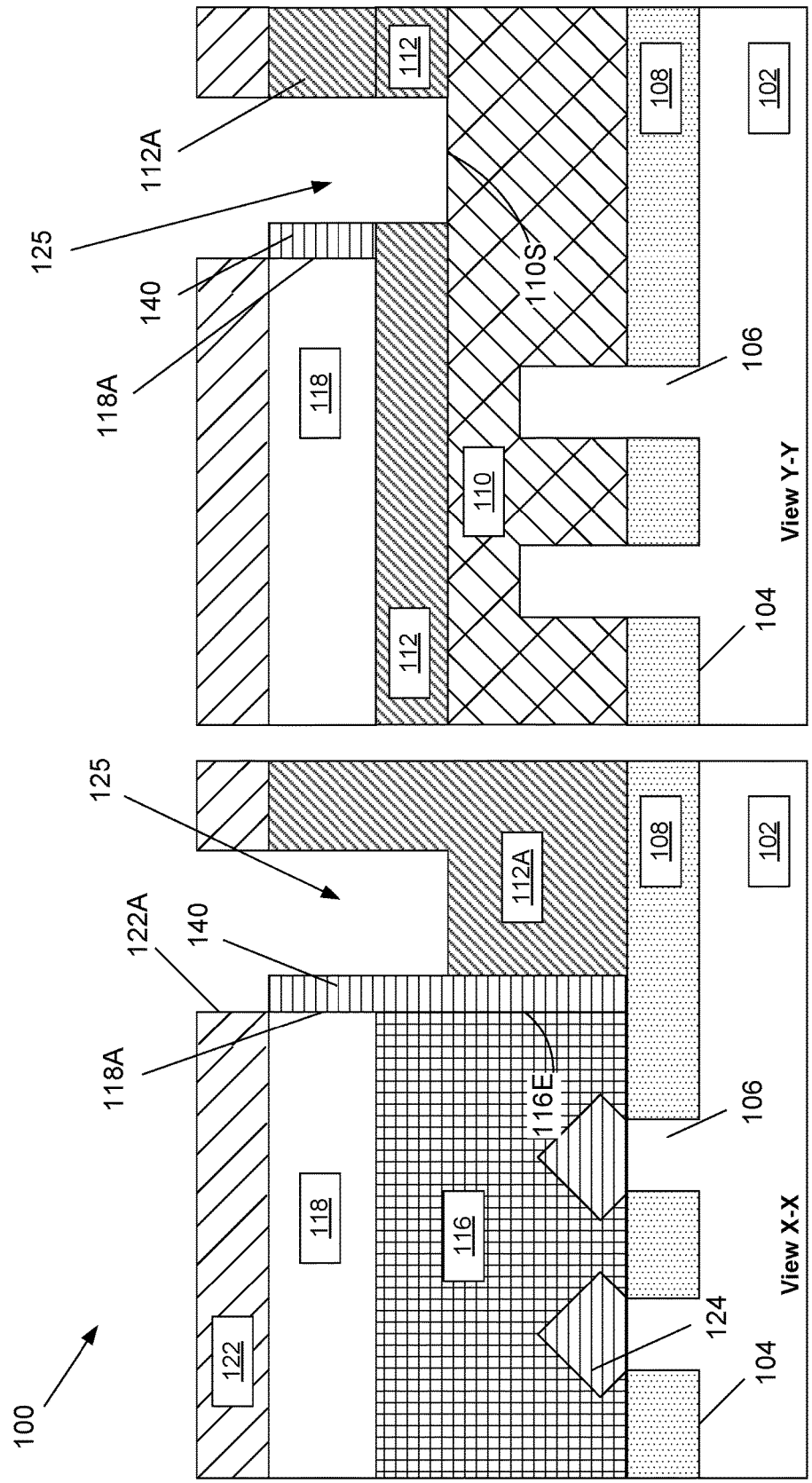

FIG. 3E depicts the product 100 after at least one etching process was performed through the opening 122A in the patterned CB etch masking layer 122 to define the CB contact opening 125 that exposes the upper surface 110S of the gate structure 110. As depicted, the etching process removes a portion of the insulating material 112A and the gate cap 112 selectively relative to the surrounding materials, including the layer of insulating material 118 and the spacer 140. The etching process also removes a vertical portion of the sidewall spacer 109 by an amount that is roughly equivalent to the thickness of the gate cap 112. The layer of insulating material 118 and the spacer 140 are not attacked (to any appreciable extent) during this etching process. Also note that the front cut face 116E of the conductive source/drain metallization structures 116 is protected by the spacer 140 during this etching process. Also note that, in this process flow, some portion of the spacer 140 is not positioned within the gate contact opening 125.

Figure 3F:
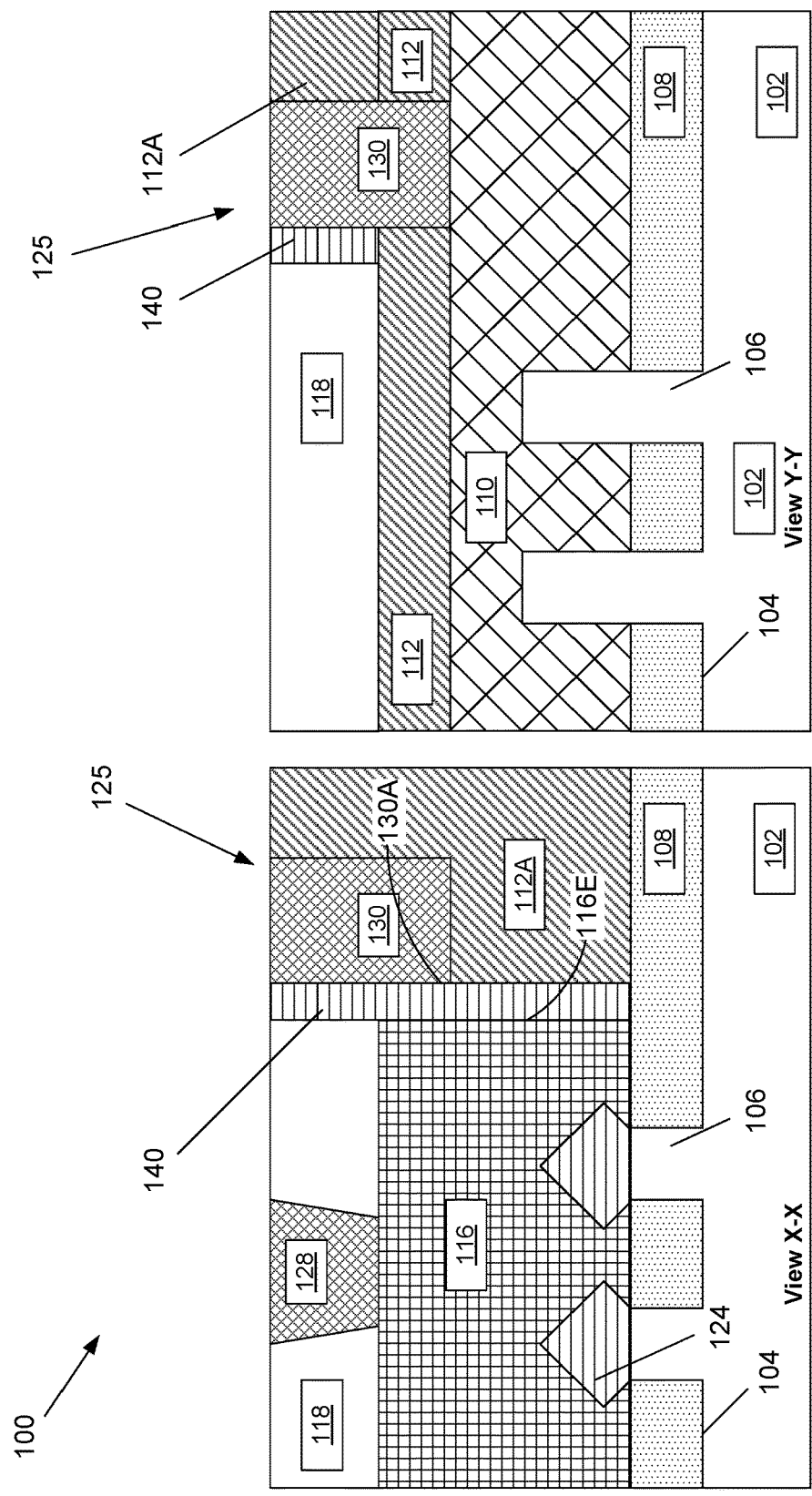

FIG. 3F depicts the product 100 after the above-described final CA contact structures 128 and final CB contact structure 130 were formed on the product 100. Note that, in the depicted example, the internal spacer 140 electrically isolates the front cut face 116E of the conductive source/drain metallization structures 116 from the edge 130A of the final CB contact structure 130 that is closest to the conductive source/drain metallization structures 116. That is, the front cut face 116E of the conductive source/drain metallization structures 116 is axially offset (in the gate width direction) from the final CB contact structure 130 by a distance which approximately corresponds to the thickness of the spacer 140.

Figure 3G:
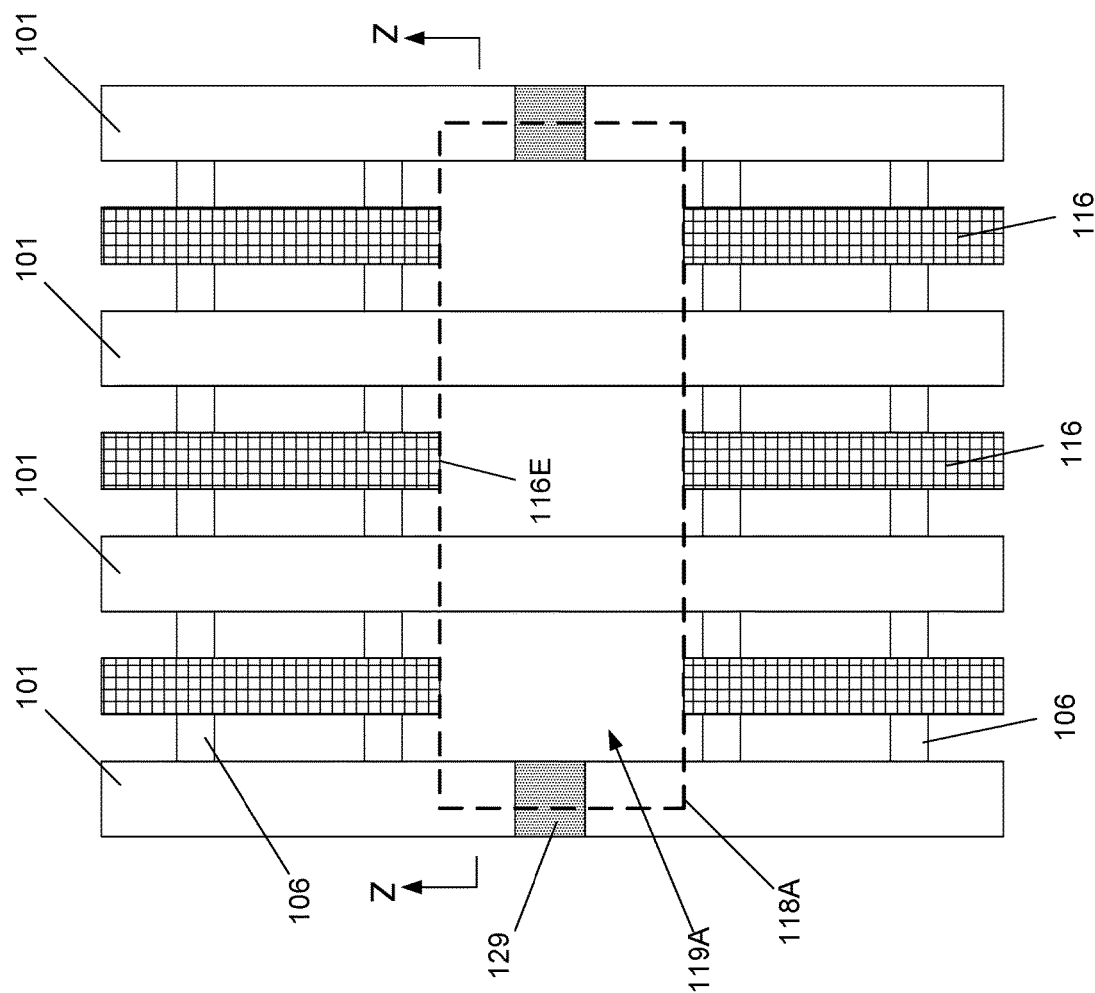

FIG. 3G is a plan view that is provided to show where a new cross-sectional view Z-Z will be taken to show further novel aspects of an integrated circuit product that is formed using the methods disclosed herein. As indicated, the view Z-Z is taken through the opening 119A where the gate contact structure 130 will eventually be formed. FIG. 3G depicts the product just after the cutting of the conductive source/drain metallization structures 116.

Figure 3H:
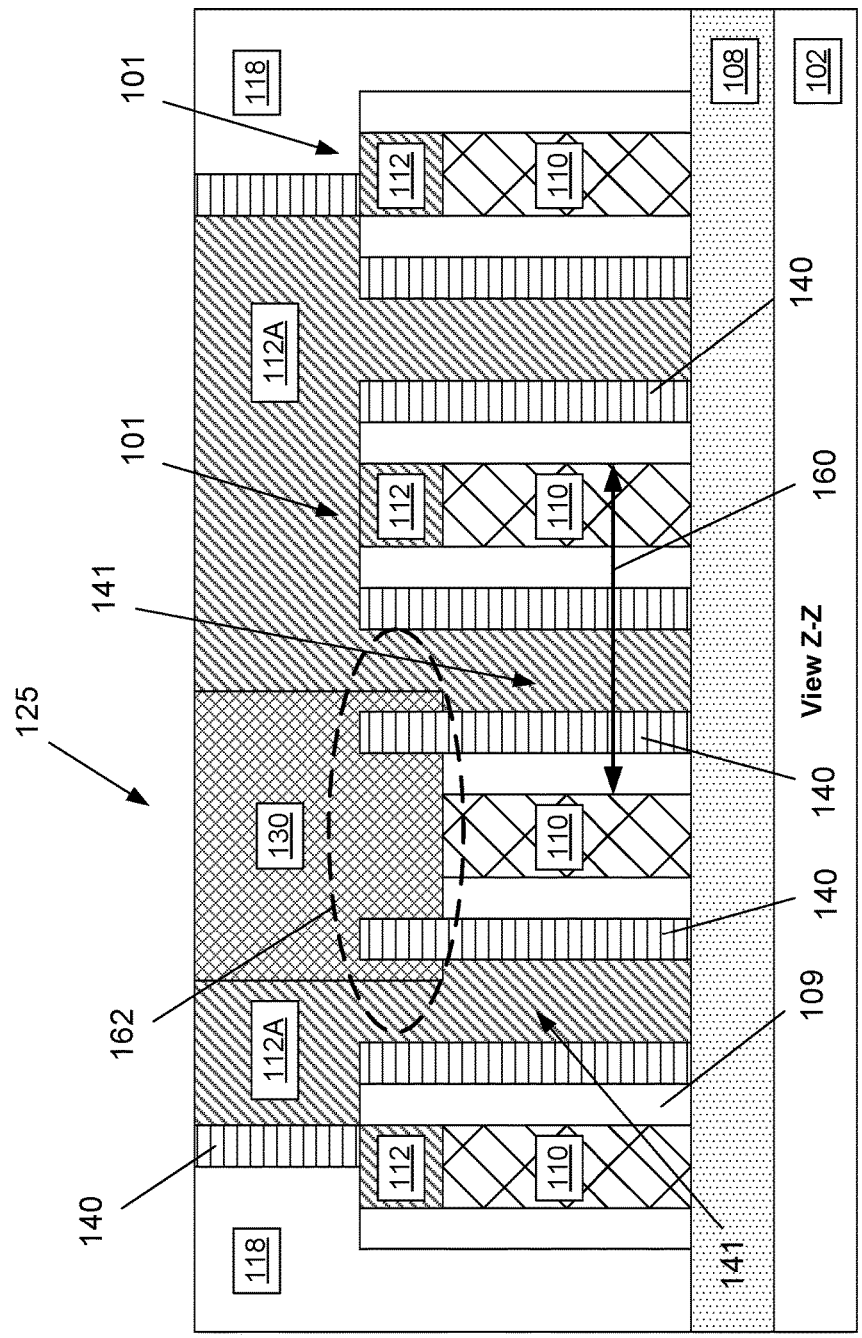

FIG. 3H depicts the situation where the gates 101 on the IC product are formed with a relatively large gate pitch 160, e.g., greater than or equal to about 52 nm. In such a situation, the spacer 140 may be formed to a relatively thin width (at its base) of about 4-10 nm. This will result in the formation of discrete spacers 140 on adjacent gate structures with a space 141 between the spacers 140 positioned on adjacent gates 101. Thus, as depicted in FIG. 3H, when the additional insulating material 112A (e.g., silicon nitride) is formed, it will fill the spaces 141 between the spacers 140. It should also be noted that, due to the formation of the spacers 140 that are not removed when the gate contact opening 125 is formed, the lower portion of the gate contact structure 130 is formed around upper portions of the spacers 140 that are located at a level that is above the upper surface 110S of the gate structure 110, as indicated in the dashed line region 162.

Figure 3I:
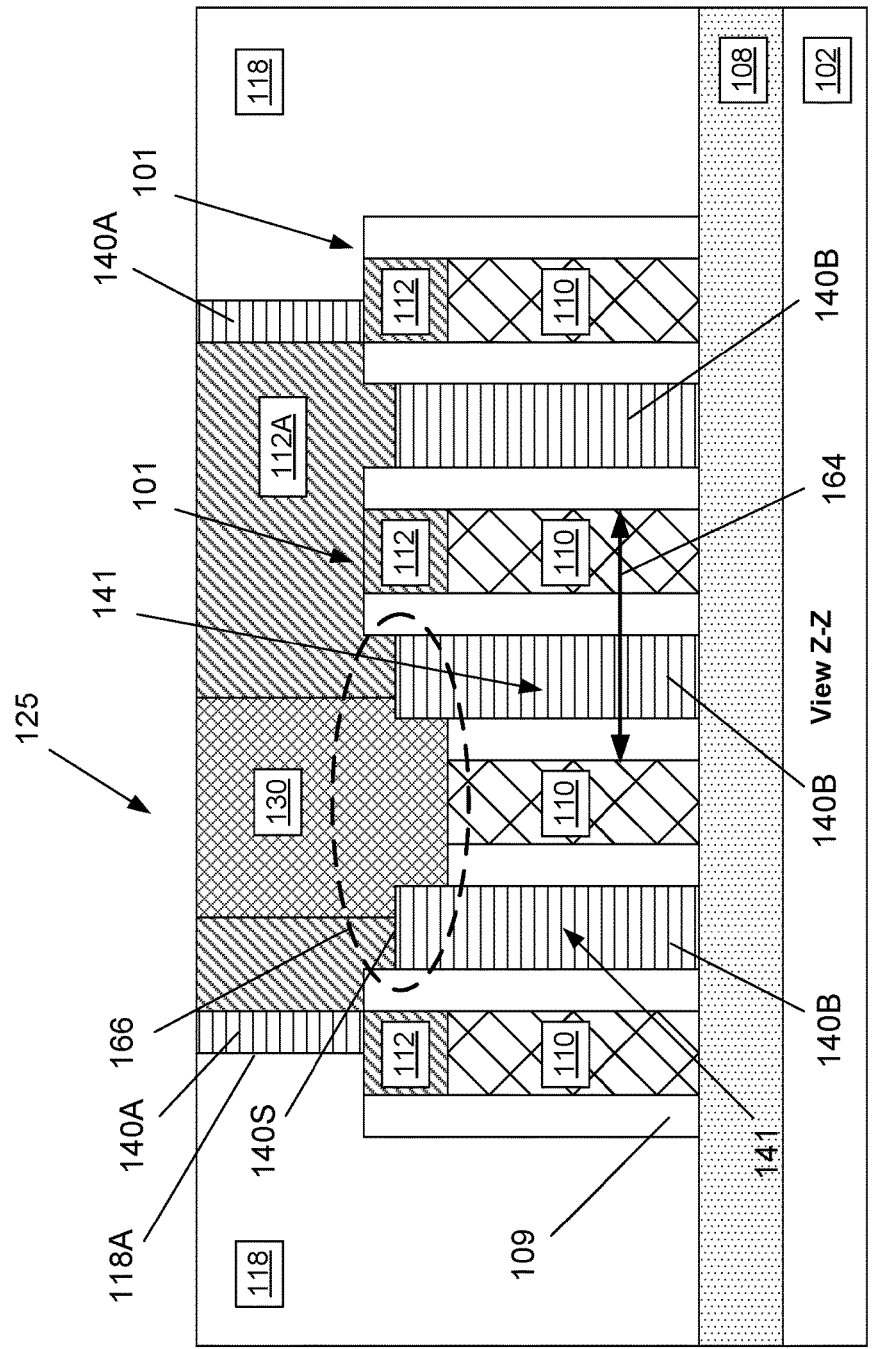

FIG. 3I depicts the situation where the gates 101 on the IC product are formed with a relatively small gate pitch 164, e.g., less than about 52 nm. In such a situation, the spacer 140 may be formed to a relatively wide width (at its base) of about 4-10 nm, This will result in the formation of a discrete spacer 140A on the sidewalls of the opening 118A in the patterned layer of insulating material 118 above the gate caps 112 of the outer gates 101. However, due to the relatively smaller gate pitch 164 and the relatively larger size of the spacer 140, the material for the spacer 140 simply "pinches off" and, accordingly, the spacer 140 has a lower portion 140B that substantially fills the spaces 141 between the adjacent gates 101, as depicted in FIG. 3I. Thus, as depicted in FIG. 3I, when the additional insulating material 112A (e.g., silicon nitride) is formed, it will form on the upper surfaces 140S of the spacer material 140B in the spaces 141 between adjacent gates 101. It should also be noted that, the spacer material 140B between the adjacent gates is not removed when the gate contact opening 125 is formed. Thus, a portion of the gate contact structure 130 is formed on a portion of the upper surface 140S of the spacer material 140B positioned in the spaces 141 between the adjacent gates, as indicated in the dashed line region 166.

FIG. 3J is a cross-sectional view that corresponds to that shown in FIG. 3B, i.e. after the conductive source/drain metallization structures 116 (to define the opening 119A) and after the spacer 140 was formed so as to have a lower portion 140B that pinches off and fills the space 141 between the adjacent gates while a more traditional sidewall spacer portion 140A is formed above the sidewall spacer 109 and above the gate cap 112.

FIG. 3K depicts the product shown in FIG. 3J after several process operations were performed. First, the above-described insulating material 112A was formed within the spacer 140 and above the lower portion 140B of the spacer 140 and adjacent the upper portion 140A of the spacer. Thereafter, the above described gate contact opening 125 was formed and the gate contact structure 130 was formed in the gate contact opening. As depicted, portions of the gate contact structure 130 are positioned on and in contact with the lower portion 140B of the spacer 140.

Although the methods above depicted the formation where the conductive line portions of the conductive source/drain metallization structures 116 were cut to form the final conductive source/drain metallization structures 116 with a front cut face 116E, the methods described above may be employed equally in cases where the final conductive source/drain metallization structures 116 are formed as discrete elements to their desired axial length 116Z using traditional patterning and masking techniques. For example, with reference to FIG. 2G, instead of filling the opening 119A with the insulating material 120, thereafter forming the gate contact opening 125 in the insulating material 120, as shown in FIG. 2L, and thereafter forming the spacer in the gate contact opening 125 (as shown in FIG. 2M), the gate contact opening 125 could be formed in the patterned layer of insulating material where the discrete conductive source/drain metallization structures 116 were initially formed followed by the formation of the spacer 126 in the gate contact opening 125. In a similar fashion, with respect to FIG. 3B, a portion of the patterned layer of insulating material where the discrete conductive source/drain metallization structures 116 were formed could be removed to expose the entire front face of the conductive source/drain metallization structures 116. At that point, the spacer 140 could be formed on the entire front face of the conductive source/drain metallization structures 116. The opening defined by the spacer 140 could then be filled with the insulating material 112A and thereafter the gate contact opening 125 could be formed in the insulating material 112A, as shown in FIG. 3E. Thus, the various inventions disclosed herein should not be considered to be limited to the manner in which the final conductive source/drain metallization structures 116 for the device were formed.

FIGS. 4A-4M depict yet other novel methods disclosed herein for methods of forming a gate contact structure above an active region of a transistor and the resulting devices. However, in this illustrative process flow, at least a portion, and in some cases an entirety, of the conductive gate contact structure 130 will be formed above the active region 103. In this illustrative process flow, the conductive source/drain metallization structures 116 will be formed as discrete elements having a desired axial length 116Z using traditional patterning and masking techniques.

Figure 4A:
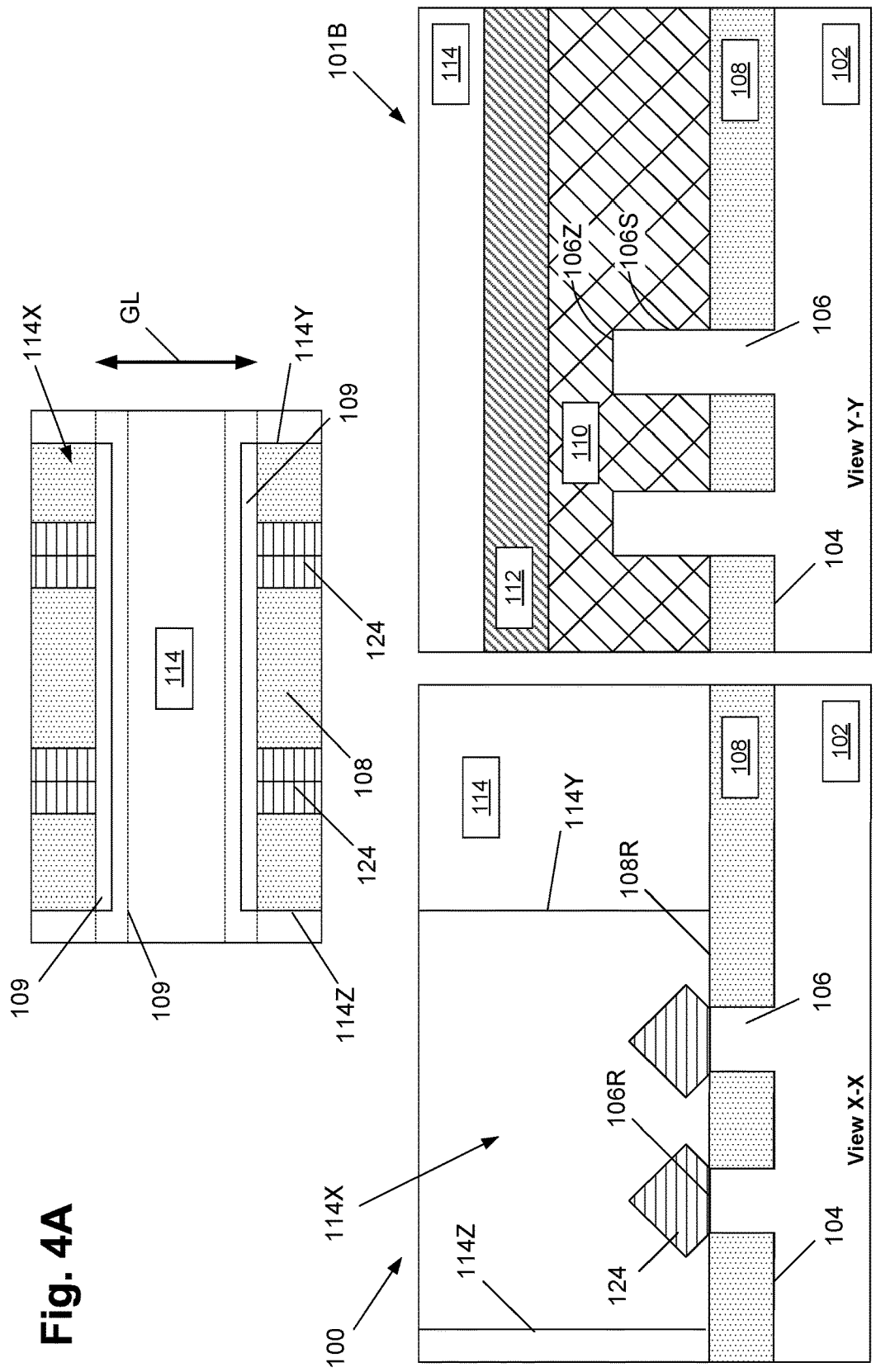

Accordingly, FIG. 4A depicts the product at a point in fabrication that corresponds approximately to that shown in FIG. 2B. However, at this point in the process flow, the layer of insulating material 114 is formed to a sufficient thickness that it is positioned above the gate cap 112 as shown in the view Y-Y. Additionally, the layer of insulating material 114 has been patterned (using traditional masking and etching techniques) to define a plurality of openings 114X that expose the underlying source/drain regions and the epi material 124. The openings 114X correspond to the desired size and location of the discrete conductive source/drain metallization structures 116 to be formed on the device. In the depicted example, the openings 114X have a front surface 114Y (nearest to where the gate contact structure 130 will eventually be formed) and a rear surface 114Z. Portions of the sidewall spacer 109 are depicted in dashed lines in the simplistic plan view.

Figure 4B:
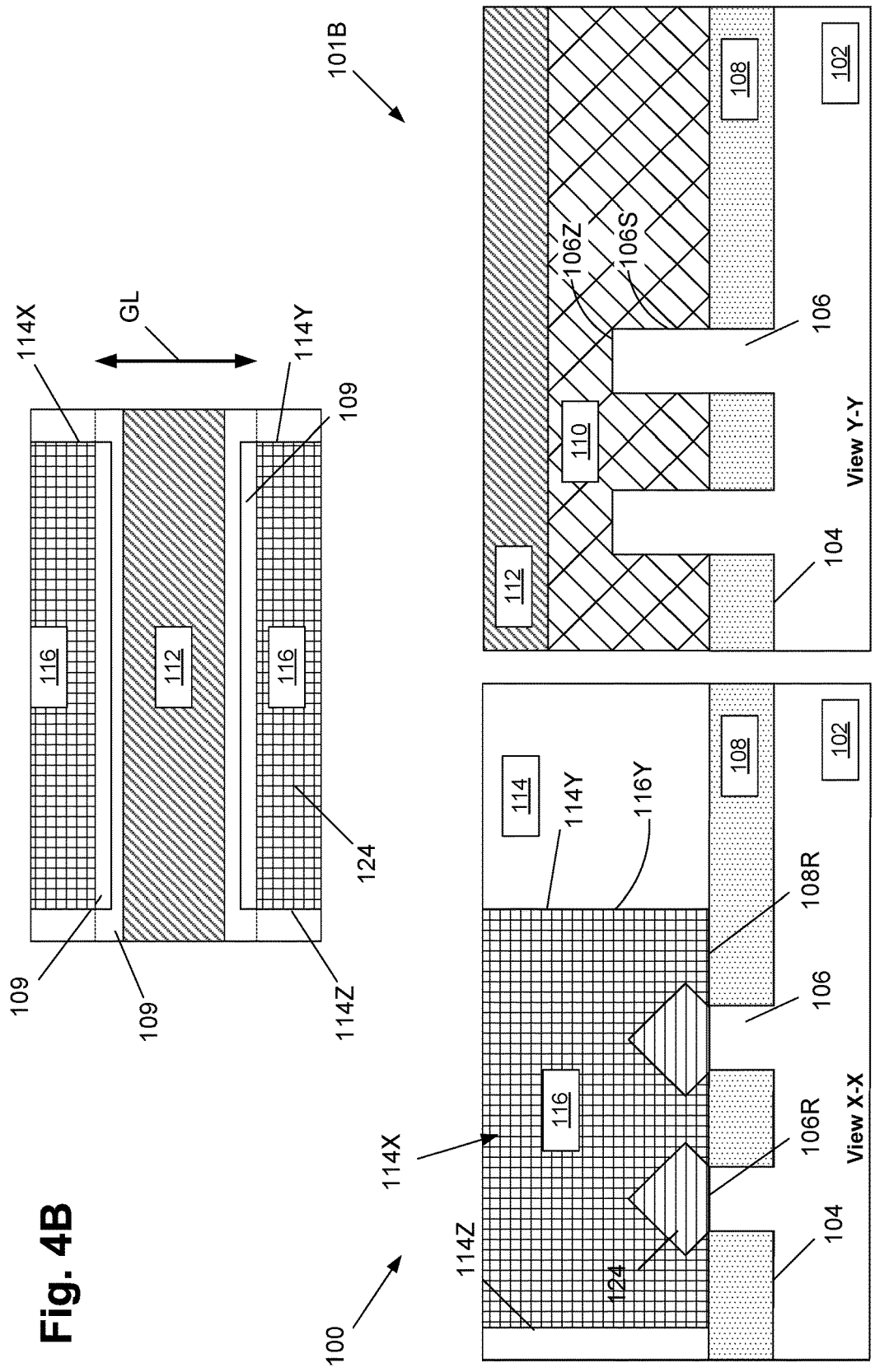

FIG. 4B depicts the product 100 after several process operations were performed. First, individual and discrete conductive source/drain metallization structures 116 were formed in the openings 114X in the layer of insulating material 114 in the source/drain regions 105 and between the adjacent gates 101. The conductive source/drain metallization structures 116 have an as-formed front face 116Y. As depicted, the conductive source/drain metallization structures 116 are conductively coupled to the epi material 124. The conductive source/drain metallization structures 116 will eventually be conductively coupled to the conductive source/drain contact structures (CA) that are to be subsequently formed on the product 100. In one illustrative process flow, a pre-clean process may be performed prior to forming metal silicide regions (not shown) that physically contacts the epi material 124. Thereafter, the conductive materials for the formation of the remaining portion of the conductive source/drain metallization structures 116 are formed in the discrete openings 114X in the layer of insulating material 114. In some cases, the conductive source/drain metallization structures 116 comprise a trench metal silicide material (not separately shown) that is formed on and in contact with the epi material 124, and a metal material or metal-containing line, such as tungsten (not separately shown), that is formed on and in contact with the trench metal silicide material. After the formation of the materials that make up the conductive source/drain metallization structures 116, a chemical mechanical polishing (CMP) process was performed to remove excess materials located above the upper surface of the layer of insulating material using the gate caps 112 as a polish stop.

FIG. 4C depicts the product after several process operations were performed. First, a layer of insulating material 121, e.g., silicon dioxide, was deposited on the product. Thereafter, a patterned etch mask 150, e.g., OPL, having an opening 150A formed therein was formed above the layer of insulating material 121. The opening 150A is positioned above a portion of the conductive source/drain metallization structures 116 that will eventually be removed, as described more fully below. Next, an etching process was performed through the patterned etch mask 150 to remove the exposed portions of the layer of insulating material 121. This process operation exposes a portion of the upper surface 116S of the conductive source/drain metallization structures 116 and a portion of the gate cap 112.

Figure 4D:
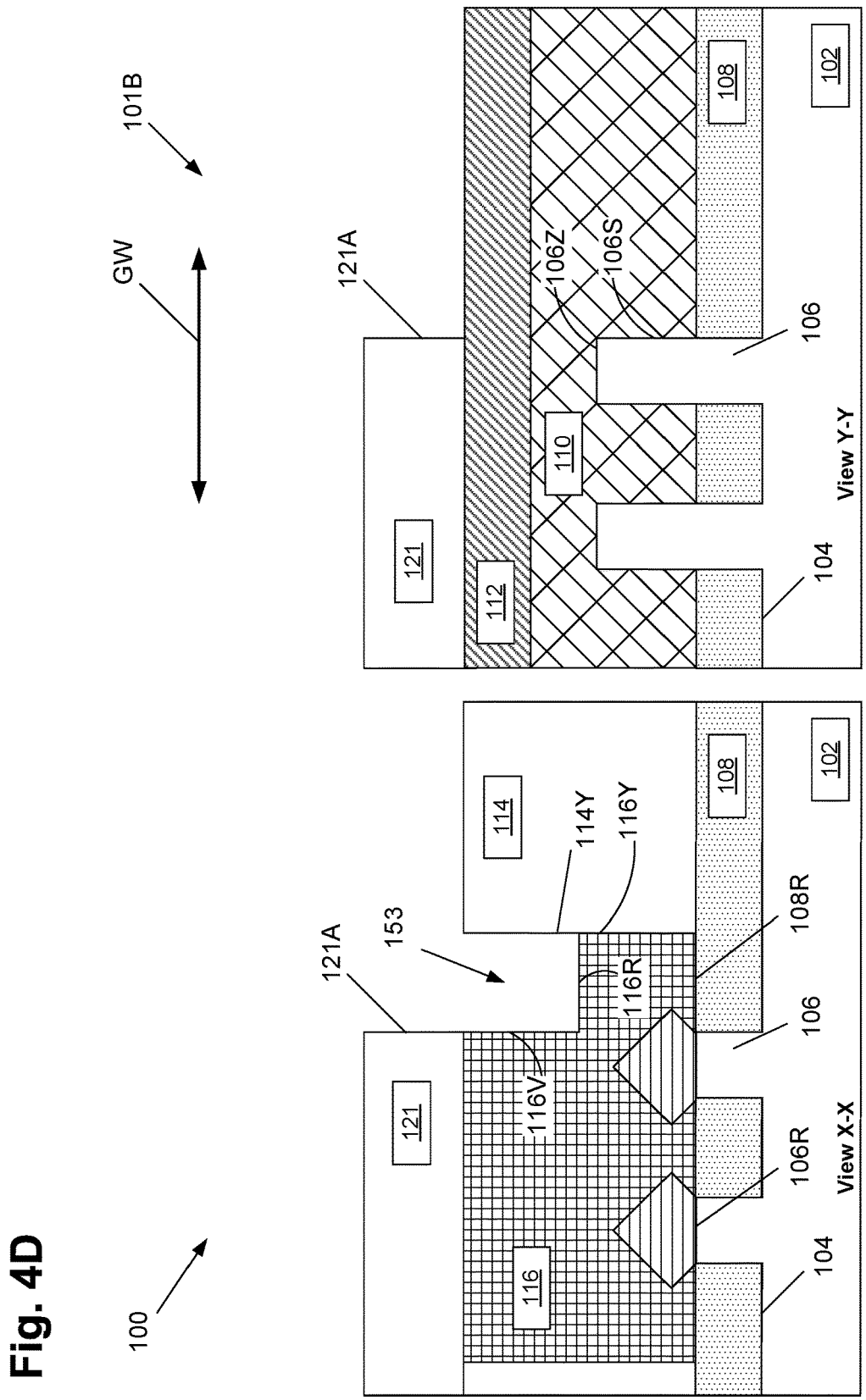

FIG. 4D depicts the product after several process operations were performed. First, an etching process was performed to selectively remove exposed portions of the conductive source/drain metallization structures 116 exposed by the opening 121A in the layer of insulating material 121 relative to the surrounding materials. The patterned etch mask 150 may or may not remain in position during this etching process. The patterned etch mask 150 is removed from the product either before or after the etching process is performed to remove portions of the conductive source/drain metallization structures 116. The etching process operation defines a recess 153 in the conductive source/drain metallization structures 116 that is defined by a bottom recessed surface 116R and a substantially vertically oriented sidewall surface 116V. Note that, in one embodiment, the formation of the recess 153 removes a portion of the front face 116Y of the conductive source/drain metallization structures 116. Also note that this recess 153 is positioned above the active region 103 of the device since the active region 103 is defined to be included in the area occupied by the conductive source/drain metallization structures 116. In one illustrative embodiment, the recess 153 may have a width (in the gate width direction) of about 20-200 nm, and a vertical depth of about 20-80 nm.

Figure 4F:
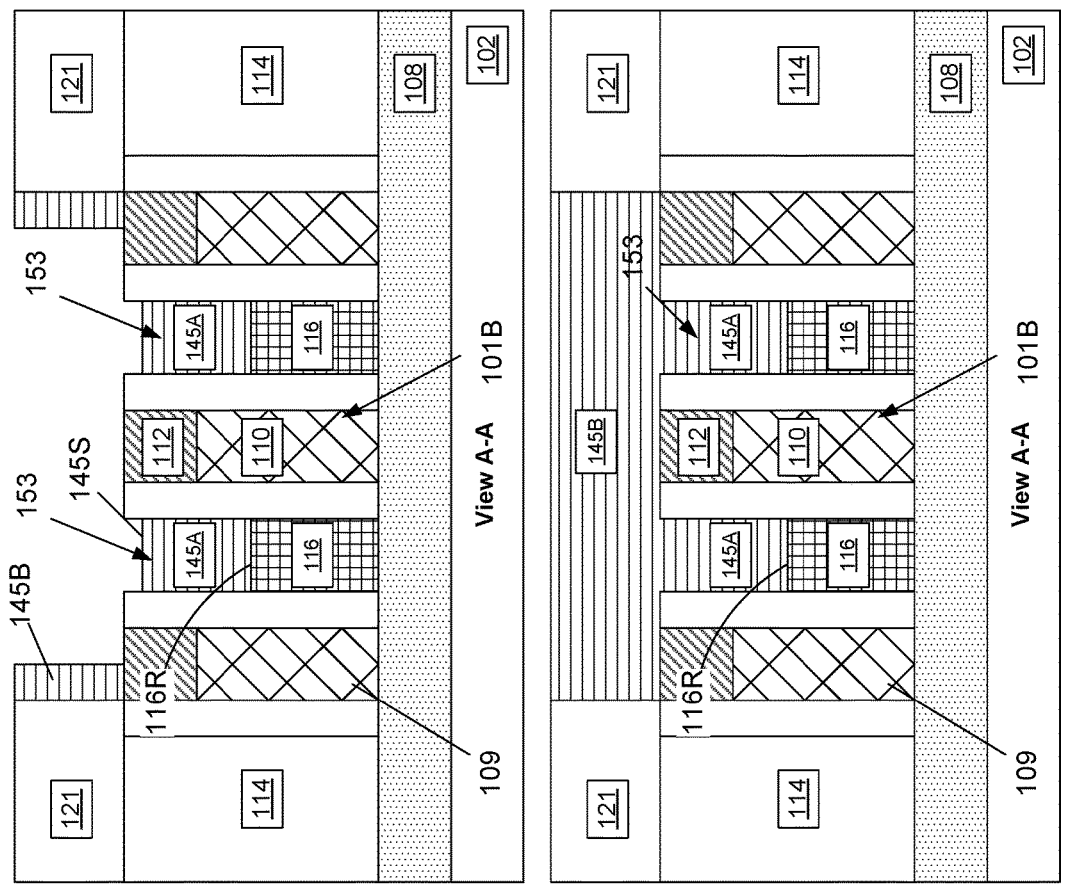

FIG. 4E depicts the product after a spacer structure 145 was formed on the product. FIG. 4F contains the cross-sectional views "A-A" and "B-B" that are taken through the spacer structure 145 at the locations indicated in FIG. 4E. The spacer structure 145 may be comprised of a variety of different materials, e.g., SiCO, SiC, SiON, SiOCN, SiCO, SiBCN, etc. The spacer structure 145 may be formed by performing a conformal deposition process to form a conformal layer of spacer material across the product and in the openings 121A and 153 and thereafter performing an anisotropic etching process on the layer of spacer material. Note that, due to the relatively small dimension of the recess 153 (in the gate width direction), the material of the spacer structure 145 effectively pinches-off and fills a substantial majority of the recess 153. The spacer structure 145 comprises a lower recess filling portion 145A (with an upper surface 145S) and an upper portion 145B. The lower recess filling portion 145A substantially fills the recesses 153 formed in the conductive source/drain metallization structures 116 formed on opposite sides of the gate 101B, as shown in view A-A of FIG. 4F. As shown in view B-B in FIG. 4F, the upper portion 145B of the spacer structure 145 extends across the gate cap 112 and a portion of the gate cap 112 is exposed within the spacer structure 145.

Figure 4G:
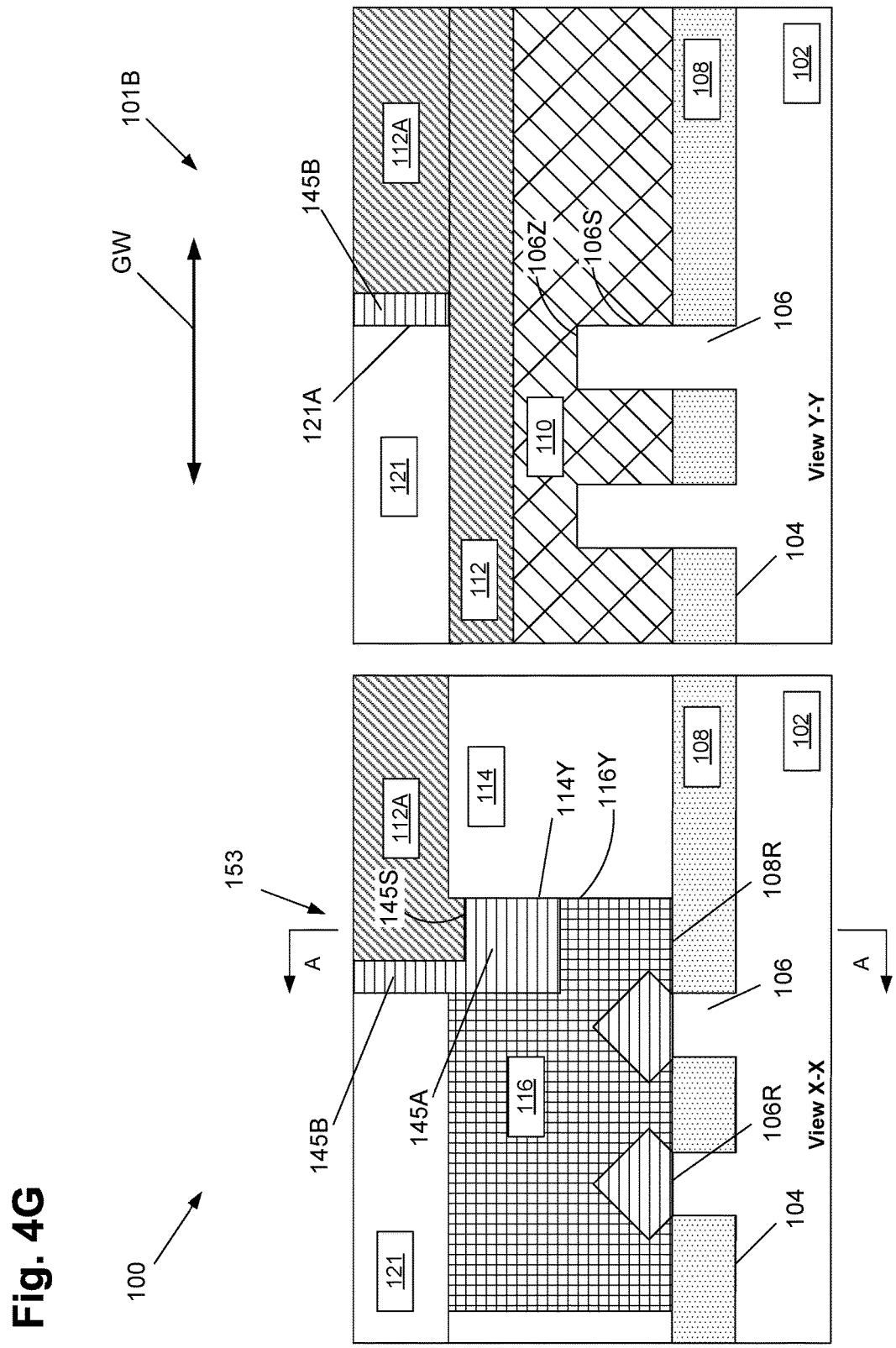
Figure 4H:
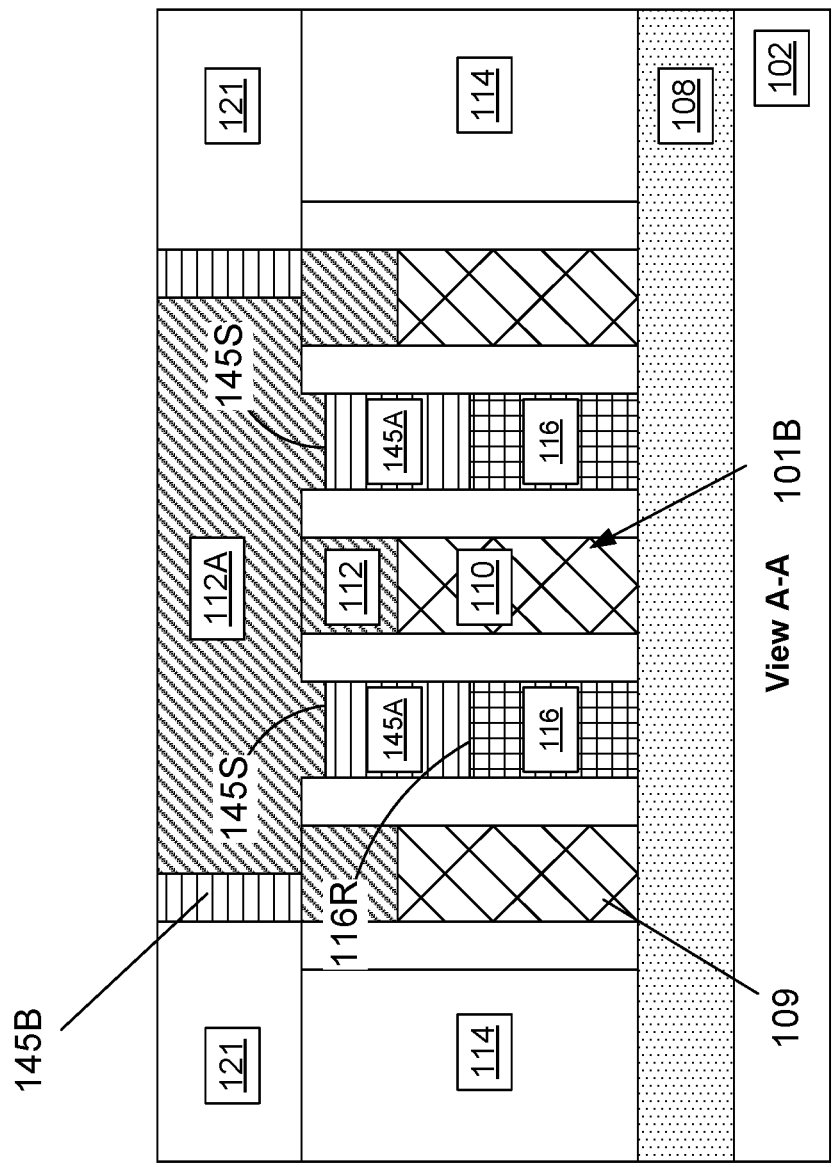

FIG. 4G depicts the product after several process operations were performed. First, the above-described insulating material 112A (e.g., silicon nitride) was formed across the product within the spacer structure 145 and above the insulating material 114. FIG. 4H contains the cross-sectional view "A-A" that is taken through the spacer structure 145 at the location indicated in FIG. 4G. As depicted, the insulating material 112A fills any remaining unfilled portion of the recesses 153 and the material 112A contacts the upper surface 145S of the lower portion 145A of the spacer structure 145. Thereafter, a CMP process was performed to remove excess amounts of the material 112A positioned outside of the opening 121A defined in the layer of insulating material 121.

Figure 4I:
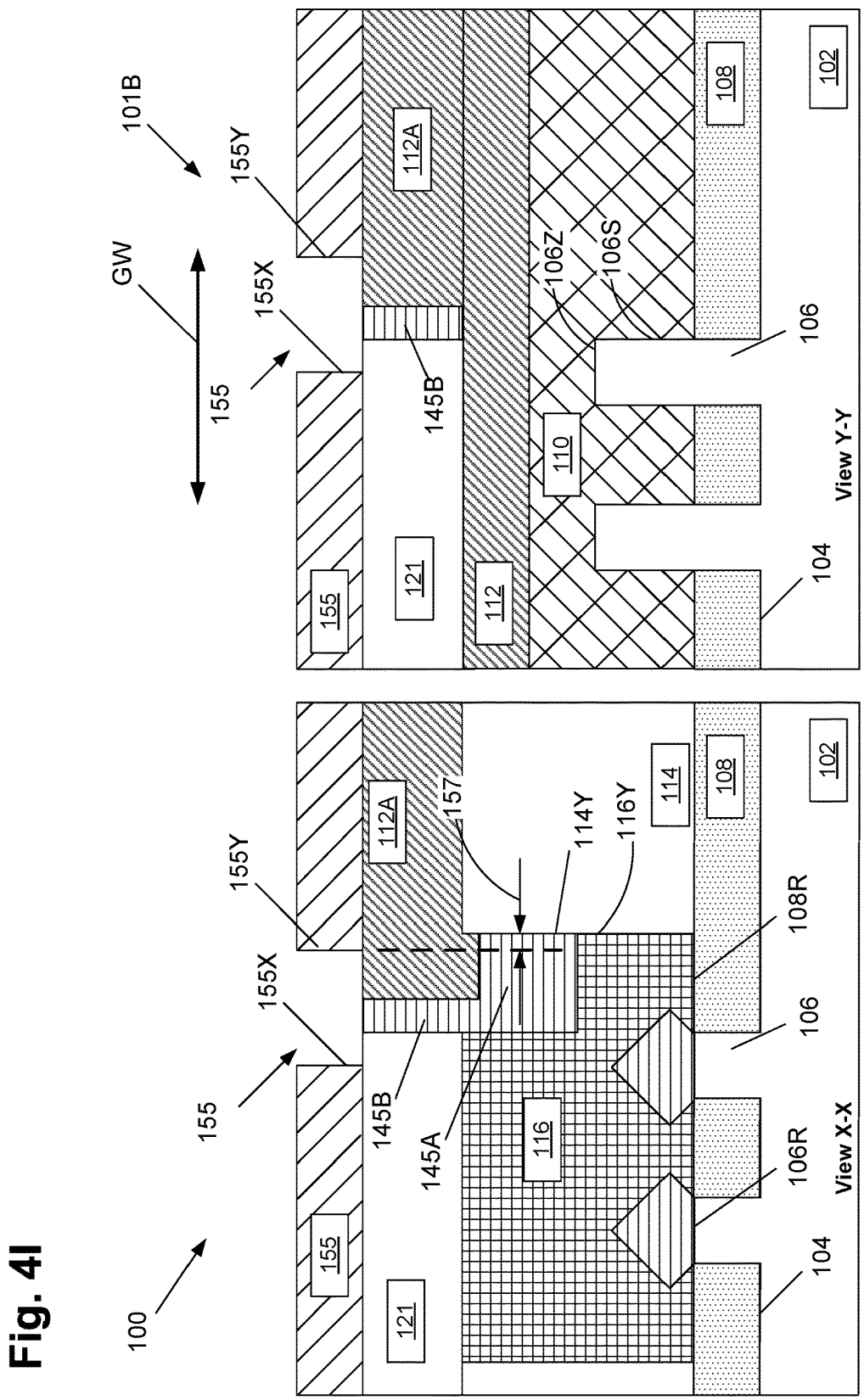

As shown in FIG. 4I, a patterned CB masking layer 155, e.g., OPL, photoresist, etc., with an opening 155 defined therein, was then formed above the product 100. In this example, a first edge 155X of the opening 155 exposes a portion of the layer of insulating material 121, a portion of the upper portion 145B of the spacer structure 145 and a portion of the additional insulating material 112A. Also note that the opening 155 is positioned such that an edge 155Y of the opening 155 is located vertically above a portion of the recess 153 defined in the conductive source/drain metallization structures 116. In some cases, the edge 155Y may be axially offset from the front face 116Y of the conductive source/drain metallization structures 116 by a distance 157 of about 0-40 nm. By positioning the gate contact opening 155 in such an axially offset manner relative to the front face 116Y of each of the conductive source/drain metallization structures 116, the gate contact structure 130 that will ultimately be formed will be formed entirely above the active region 103.

Figure 4K:
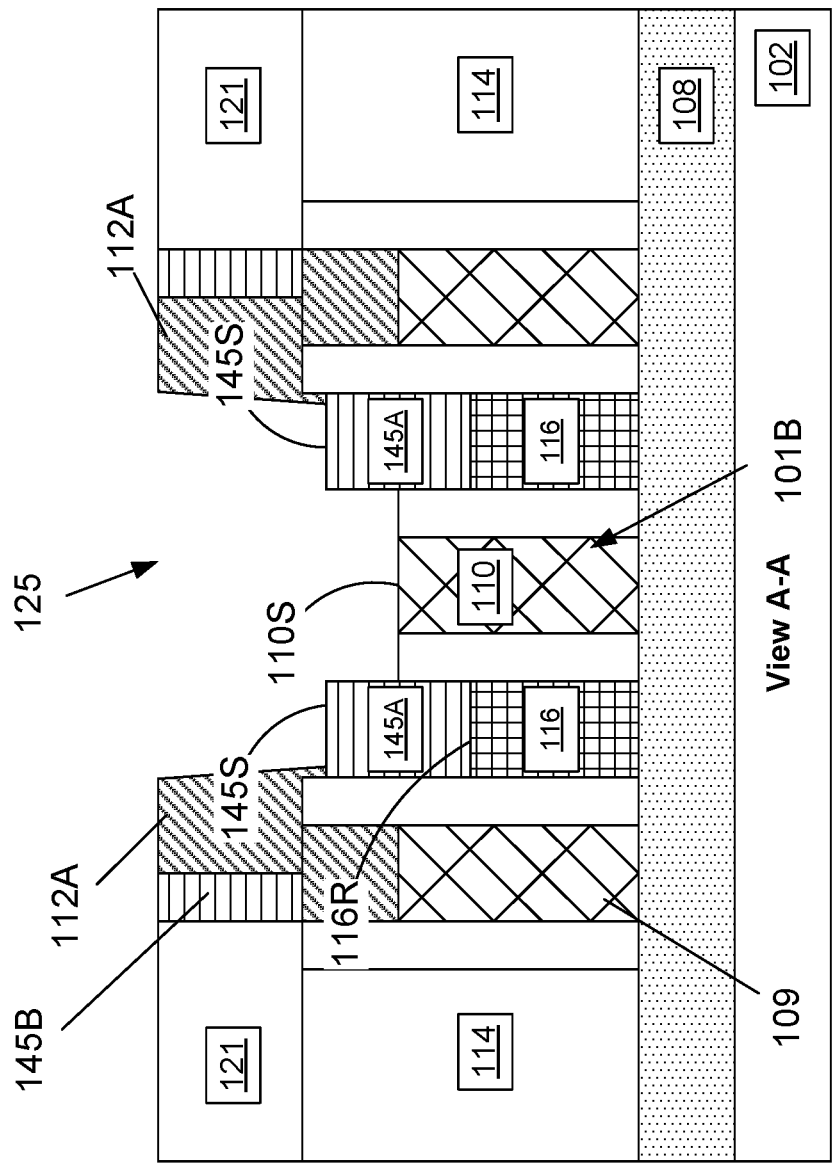

FIG. 4J depicts the product after several process operations were performed. FIG. 4K contains the cross-sectional view "A-A" that is taken through the gate contact opening 125 at the location indicated in FIG. 4J. First, an etching process was performed through the patterned etch mask 155 to define the gate contact opening 125. The gate contact opening 125 exposes a portion of the upper surface 110S of the gate structure 110 and a portion of the recess filling portion 145A of the spacer structure 145 including a portion of the upper surface 145S. Thereafter, the patterned etch mask 155 was removed. Note that, as shown in the view X-X, in forming the gate contact opening 125, the spacer structure 145 was not etched. As depicted in the view Y-Y, the gate contact opening 125 extends through the material 112A as well as the gate cap 112.

Figure 4L:
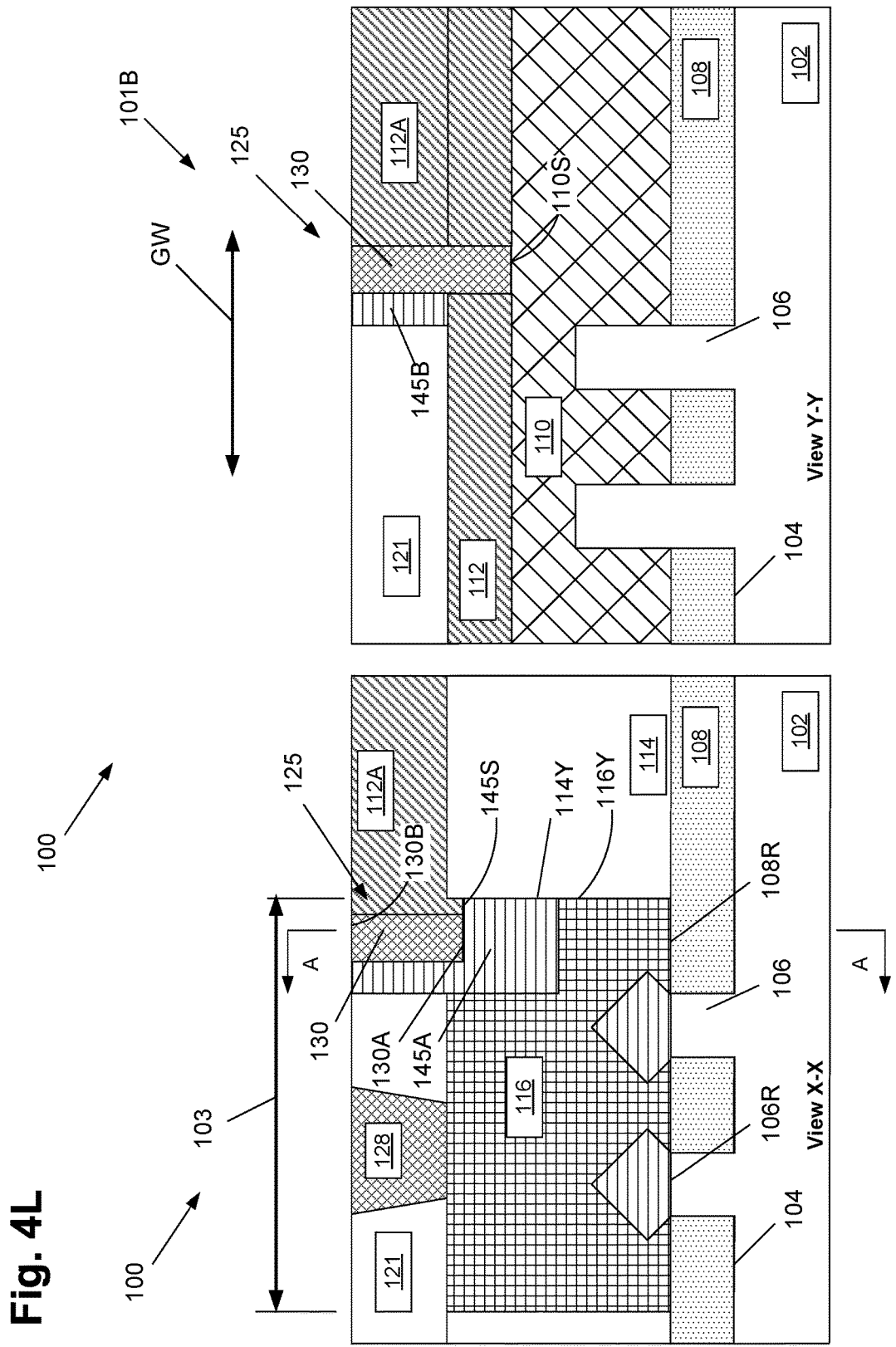
Figure 4M:
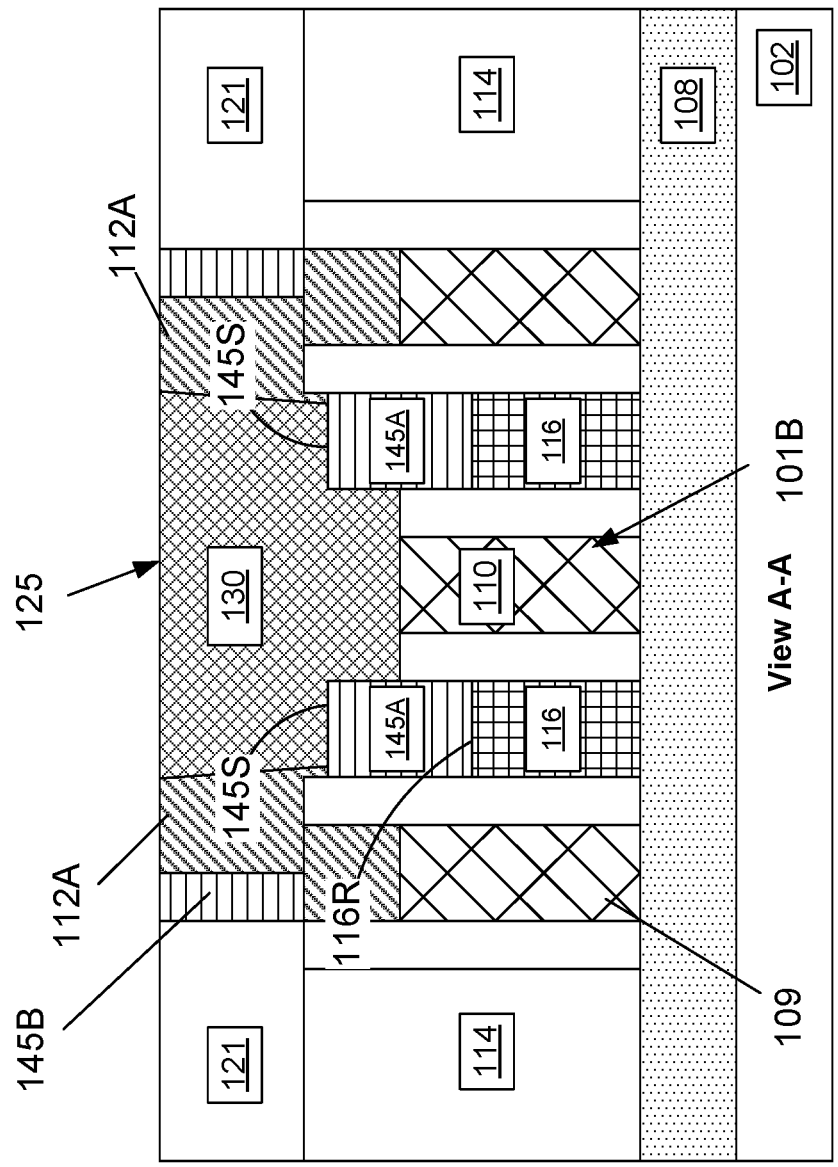

FIG. 4L depicts the product after the above-described final CA contact structures 128 and the final CB contact structure 130 were formed on the product 100. FIG. 4M contains the cross-sectional view "A-A" that is taken through the gate contact structure 130 and the spacer structure 145 at the location indicated in FIG. 4L. Note that, as shown in these drawings, the CB contact structure 130 is formed on and in contact with a portion of the upper surface 145S of the recess filling portion 145A of the spacer structure 145 formed in the recess 153 defined in each of the conductive source/drain metallization structures 116. Also note that, due to the processing described above, at least the entirety of a bottom surface 130A of the CB contact structure 130 is positioned vertically above the active area 103. In some applications, the entirety of an upper surface 130B may also be positioned vertically above the active region 103. By forming the CB contact structure 130 in such a manner that at least a portion and sometimes the entirety of the CB contact structure 130 is positioned vertically above the active region 103, even more area savings may be obtained.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a conductive gate contact structure (CB) for a transistor comprising a plurality of source/drain regions, the method comprising:
    forming a gate above a semiconductor substrate, said gate comprising a gate structure and a gate cap positioned above said gate structure;
    forming a conductive source/drain metallization structure adjacent said gate in each of said source/drain regions;
    forming a recess in each of said conductive source/drain metallization structures;
    after forming said recess in each of said conductive source/drain metallization structures, forming a spacer structure that comprises lower recess filling portions that substantially fill said recesses and an upper portion that extends across and covers a first portion of an upper surface of said gate cap, wherein a second portion of said upper surface of said gate cap is exposed within said spacer structure and wherein said recess filling portions have an upper surface;
    forming an insulating material within said spacer structure and on said exposed second portion of said upper surface of said gate cap, wherein said insulating material is positioned on said upper surface of said recess filling portions;
    performing at least one etching process to remove a portion of said insulating material and a portion of said gate cap selectively relative to said spacer structure so as to thereby define a gate contact opening that exposes a portion of an upper surface of said gate structure, wherein at least some of said insulating material positioned above said upper surfaces of said recess filling portions of said spacer structure is removed during said at least one etching process; and
    forming said conductive gate contact structure (CB) in said gate contact opening, wherein said conductive gate contact structure (CB) is conductively coupled to said gate structure and wherein said conductive gate contact structure (CB) contacts said upper surfaces of said lower recess filling portions of said spacer structure.

2. The method of claim 1, wherein said conductive source/drain metallization structures comprise a metal silicide region and a metal-containing material.

3. The method of claim 1, wherein said conductive source/drain metallization structures comprise a front face and wherein forming said recesses comprises removing a portion of said front face of each of said conductive source/drain metallization structures so as to define a recess comprising a bottom surface and a sidewall surface.

4. The method of claim 1, wherein an entirety of a bottom surface of said conductive gate contact structure (CB) is positioned vertically above an active region of said transistor.

5. The method of claim 4, wherein an entirety of an upper surface of said conductive gate contact structure (CB) is positioned vertically above said active region of said transistor.

6. The method of claim 1, wherein forming a conductive source/drain metallization structure adjacent said gate in each of said source/drain regions comprises forming at least a portion of said conductive source/drain metallization structure in a patterned layer of insulating material that has a plurality of patterned openings positioned above said source/drain regions.

7. The method of claim 1, wherein forming said insulating material within said spacer structure comprises forming an insulating material comprising one of silicon nitride, SiON, SiOCN, SiCO or SiBCN within said spacer structure.

8. The method of claim 1, wherein forming said insulating material within said spacer structure comprises forming an insulating material comprised of a material that is the same as a material of said gate cap.

9. A method of forming a conductive gate contact structure (CB) for a transistor comprising a plurality of source/drain regions, the method comprising:
    forming a recess in each of a first and a second conductive source/drain metallization structure that are positioned in said source/drain regions on opposite sides of a gate by removing at least a portion of a front face of each of said first and second conductive source/drain metallization structures, said gate comprising a gate structure and a gate cap positioned above said gate structure;
    forming a spacer structure that comprises lower recess filling portions that substantially fill said recesses and an upper portion that extends across said gate cap, wherein a portion of said gate cap is exposed within said spacer structure and wherein said lower recess filling portions have an upper surface;
    forming an insulating material within said spacer structure and on said exposed portion of said gate cap, wherein said insulating material is positioned on said upper surface of said lower recess filling portions;
    performing at least one etching process to remove a portion of said insulating material and a portion of said gate cap selectively relative to said spacer structure so as to thereby define a gate contact opening that exposes a portion of an upper surface of said gate structure, wherein at least some of said insulating material positioned above said upper surfaces of said lower recess filling portions of said spacer structure is removed during said at least one etching process; and
    forming said conductive gate contact structure (CB) in said gate contact opening, wherein said conductive gate contact structure (CB) is conductively coupled to said gate structure and wherein said conductive gate contact structure (CB) contacts said upper surfaces of said recess filling portions of said spacer structure and wherein an entirety of a bottom surface of said conductive gate contact structure (CB) is positioned vertically above an active region of said transistor.

10. The method of claim 9, wherein an entirety of an upper surface of said conductive gate contact structure (CB) is positioned vertically above said active region of said transistor.

11. The method of claim 9, wherein said front face of each of said first and second conductive source/drain metallization structures is substantially vertically oriented.

12. The method of claim 9, wherein said conductive gate contact structure (CB) is formed in direct contact with said portion of said upper surface of said gate structure exposed by said gate contact opening.

13. The method of claim 1, wherein said first and second conductive source/drain metallization structures each have a substantially vertically oriented front face.

14. The method of claim 1, wherein said conductive gate contact structure (CB) is formed in direct contact with said portion of said upper surface of said gate structure exposed by said gate contact opening.

15. A method of forming a conductive gate contact structure (CB) for a transistor comprising a plurality of source/drain regions, the method comprising:
 forming a gate above a semiconductor substrate, said gate comprising a gate structure and a gate cap positioned above said gate structure;
 forming a conductive source/drain metallization structure adjacent said gate in each of said source/drain regions, each of said conductive source/drain metallization structures having a front face that is positioned laterally adjacent to a sidewall surface of a first layer of insulating material;
 forming a recess in each of said conductive source/drain metallization structures, each of said recesses exposing a portion of a sidewall surface of said first layer of insulating material;
 forming a second layer of insulating material above said gate and above said conductive source/drain metallization structures, said second layer of insulating material comprising:
  first portions that at least partially fill each of said respective recesses and cover at least part of said exposed portions of said respective sidewall surfaces of said first layer of insulating material; and
  a second portion that extends across and covers a first upper surface portion of said gate cap and exposes a second upper surface portion of said gate cap;
 forming a third layer of insulating material above said first and second layers of insulating material and above said gate cap, said third layer of insulating material covering said second portion of said upper surface of said gate cap, an upper surface of said first layer of insulating material, an upper surface of said respective first portions of said second layer of insulating material, and a sidewall surface of said second portion of said second layer of insulating material;
 forming a gate contact opening that extends through said third layer of insulating material to expose said upper surfaces of said respective first portions of said second layer of insulating material, and extends through said third layer of insulating material and said gate cap to expose a portion of an upper surface of said gate structure, but does not expose any portions of said conductive source/drain metallization structures; and
 forming said conductive gate contact structure (CB) in said gate contact opening, wherein said conductive gate contact structure (CB) is conductively coupled to said gate structure and directly contacts said upper surfaces of said respective first portions of said second layer of insulating material.

16. The method of claim 15, wherein an entirety of a bottom surface of said conductive gate contact structure (CB) is positioned vertically above an active region of said transistor.

17. The method of claim 16, wherein an entirety of an upper surface of said conductive gate contact structure (CB) is positioned vertically above said active region of said transistor.

18. The method of claim 15, wherein said front face of each of said conductive source/drain metallization structures is substantially vertically oriented.

19. The method of claim 15, wherein said conductive gate contact structure (CB) is formed in direct contact with said portion of said upper surface of said gate structure exposed by said gate contact opening.

20. The method of claim 15, wherein said gate cap is a same material as said third layer of insulating material, and wherein said second layer of insulating material is a different material from said gate cap and said third layer of insulating material.

* * * * *